(12) United States Patent
Hasegawa

(10) Patent No.: US 12,500,202 B2
(45) Date of Patent: Dec. 16, 2025

(54) SEMICONDUCTOR DEVICE AND MANUFACTURING METHOD THEREOF

(71) Applicant: Kioxia Corporation, Tokyo (JP)

(72) Inventor: Kazuma Hasegawa, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 445 days.

(21) Appl. No.: 18/065,084

(22) Filed: Dec. 13, 2022

(65) Prior Publication Data

US 2024/0079370 A1   Mar. 7, 2024

(30) Foreign Application Priority Data

Sep. 1, 2022   (JP) .................................. 2022-139469

(51) Int. Cl.
*H01L 23/00*   (2006.01)
*H01L 25/00*   (2006.01)
(Continued)

(52) U.S. Cl.
CPC .............. *H01L 24/49* (2013.01); *H01L 24/32* (2013.01); *H01L 24/48* (2013.01); *H01L 24/73* (2013.01); *H01L 25/0652* (2013.01); *H01L 25/50* (2013.01); *H01L 25/16* (2013.01); *H01L 2224/32145* (2013.01); *H01L 2224/32225* (2013.01); *H01L 2224/48011* (2013.01); *H01L 2224/48091* (2013.01); *H01L 2224/48095* (2013.01); *H01L 2224/48147* (2013.01); *H01L 2224/48227* (2013.01); *H01L 2224/48465* (2013.01); *H01L 2224/4903* (2013.01); *H01L 2224/49052* (2013.01); *H01L 2224/4917* (2013.01); *H01L 2224/73215* (2013.01); (Continued)

(58) Field of Classification Search
CPC .................... H01L 25/043; H01L 2225/06562
See application file for complete search history.

(56) References Cited

U.S. PATENT DOCUMENTS

| | | | |
|---|---|---|---|
| 10,312,219 B2 | 6/2019 | Ng et al. | |
| 10,971,473 B2 | 4/2021 | Kosaka | |

(Continued)

FOREIGN PATENT DOCUMENTS

| | | | |
|---|---|---|---|
| TW | 201931549 A | 8/2019 | |
| TW | 202226522 A | 7/2022 | |

*Primary Examiner* — Yu-Hsi D Sun
(74) *Attorney, Agent, or Firm* — Finnegan, Henderson, Farabow, Garrett & Dunner, LLP

(57) ABSTRACT

A semiconductor device according to an embodiment includes a substrate, a first semiconductor chip, a second semiconductor chip, a first wire and a second wire. The substrate includes a first surface. The first semiconductor chip is provided on the first surface. The second semiconductor chip is provided at a position on the first surface that is apart from a position of the first semiconductor chip in a first direction. The first wire is electrically connected to the first semiconductor chip, and is provided to extend to the side of the second semiconductor chip. The second wire is electrically connected to the second semiconductor chip, and is provided to extend to the side of the first semiconductor chip. The first wire and the second wire cross as viewed in a third direction substantially perpendicular to both of the first direction and a second direction substantially perpendicular to the first surface.

15 Claims, 25 Drawing Sheets

(51) Int. Cl.
*H01L 25/065* (2023.01)
*H01L 25/16* (2023.01)

(52) U.S. Cl.
CPC ............... *H01L 2224/73265* (2013.01); *H01L 2924/1438* (2013.01); *H01L 2924/15311* (2013.01)

(56) References Cited

U.S. PATENT DOCUMENTS

| | | |
|---|---|---|
| 11,133,284 B2 | 9/2021 | Fang et al. |
| 11,309,281 B2 | 4/2022 | Tai et al. |
| 2008/0099896 A1 | 5/2008 | Shen et al. |
| 2012/0286411 A1 | 11/2012 | Watanabe et al. |
| 2017/0141020 A1* | 5/2017 | Villavicencio ...... H01L 21/4825 |
| 2020/0075543 A1 | 3/2020 | Kosaka |
| 2020/0212005 A1 | 7/2020 | Fang et al. |
| 2021/0407956 A1 | 12/2021 | Noh et al. |
| 2023/0110997 A1* | 4/2023 | Otsuka ................ H01L 25/0652 257/777 |
| 2024/0023346 A1* | 1/2024 | Cheong ................... H01L 24/49 |
| 2025/0112197 A1* | 4/2025 | Hsiao ..................... H01L 24/48 |

\* cited by examiner

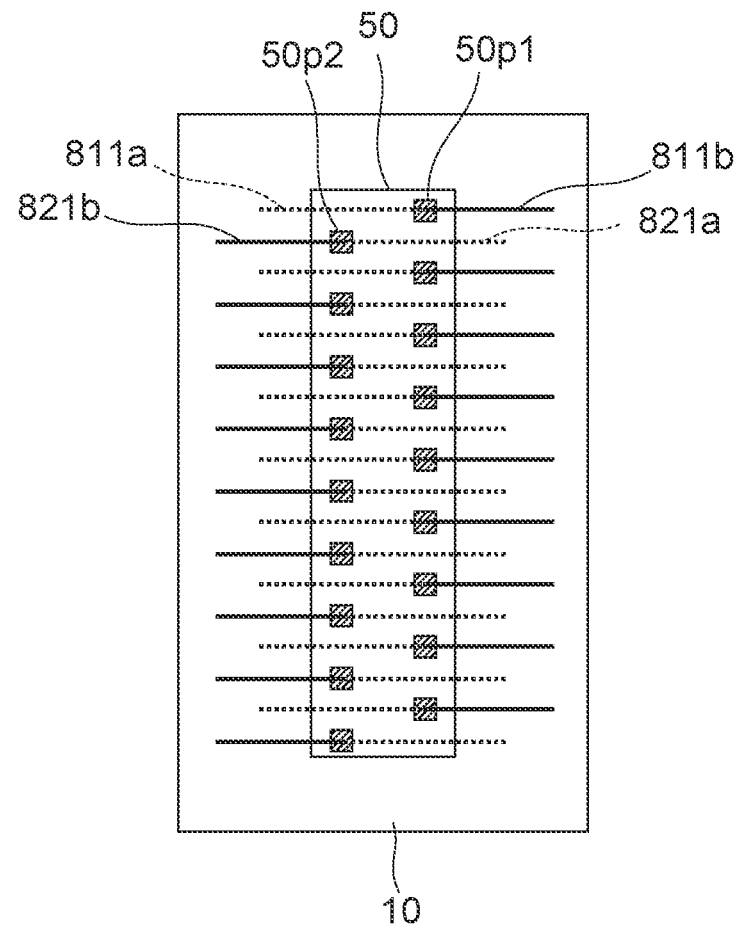
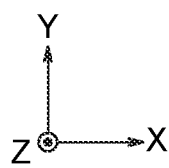
FIG.10B

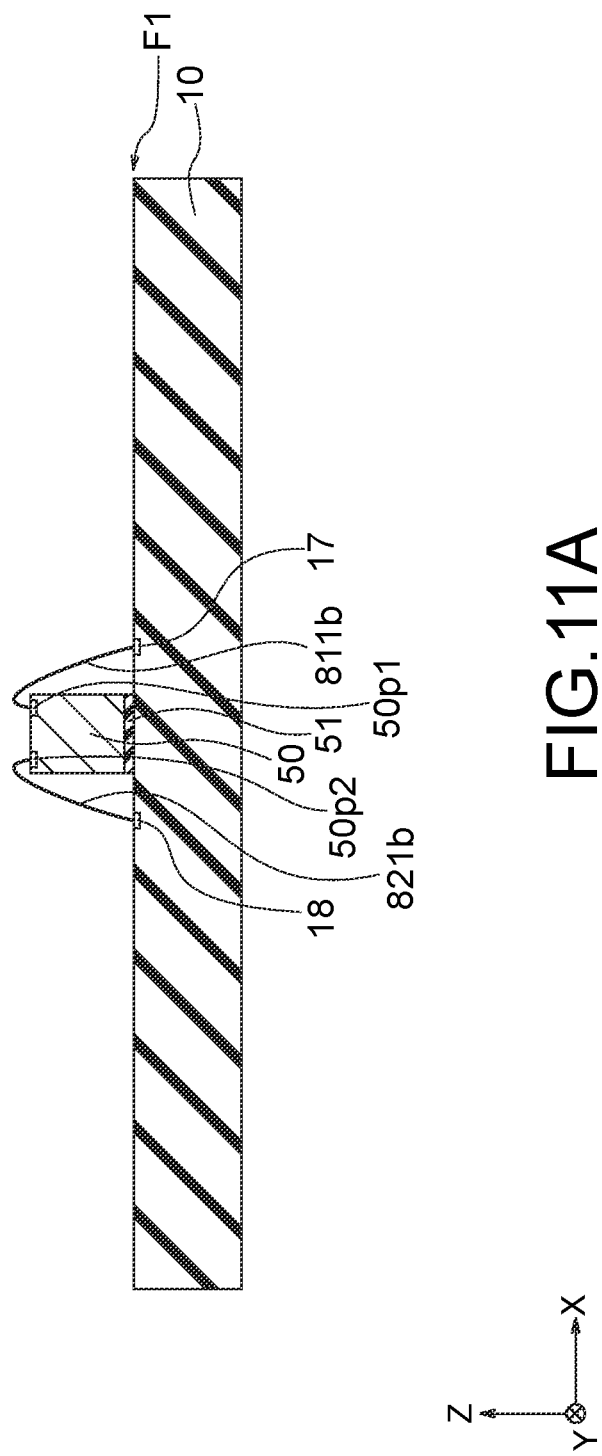

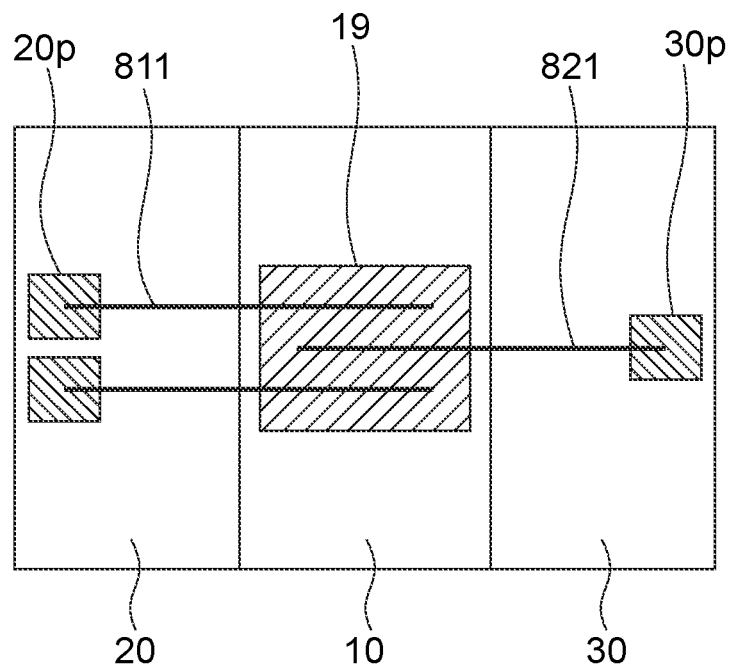
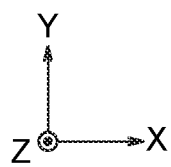
FIG.17

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2022-139469, filed on Sep. 1, 2022, the entire contents of which are incorporated herein by reference.

FIELD

The embodiments of the present invention relate to a semiconductor device and a manufacturing method thereof.

BACKGROUND

In a semiconductor package, occasionally, a semiconductor chip is provided on a substrate, and a wire connecting the substrate and the semiconductor chip is provided. For downsizing of the package, it is desired to reduce the installation area.

BRIEF DESCRIPTION OF THE DRAWINGS

FIG. 10B is a top view showing the exemplary configuration of the semiconductor device according to the seventh embodiment;

FIG. 11A is a sectional view showing an exemplary manufacturing method of the semiconductor device according to the seventh embodiment;

FIG. 17 is a top view showing an exemplary configuration of bonding wires and a pad according to the ninth embodiment;

DETAILED DESCRIPTION

Figure 1:
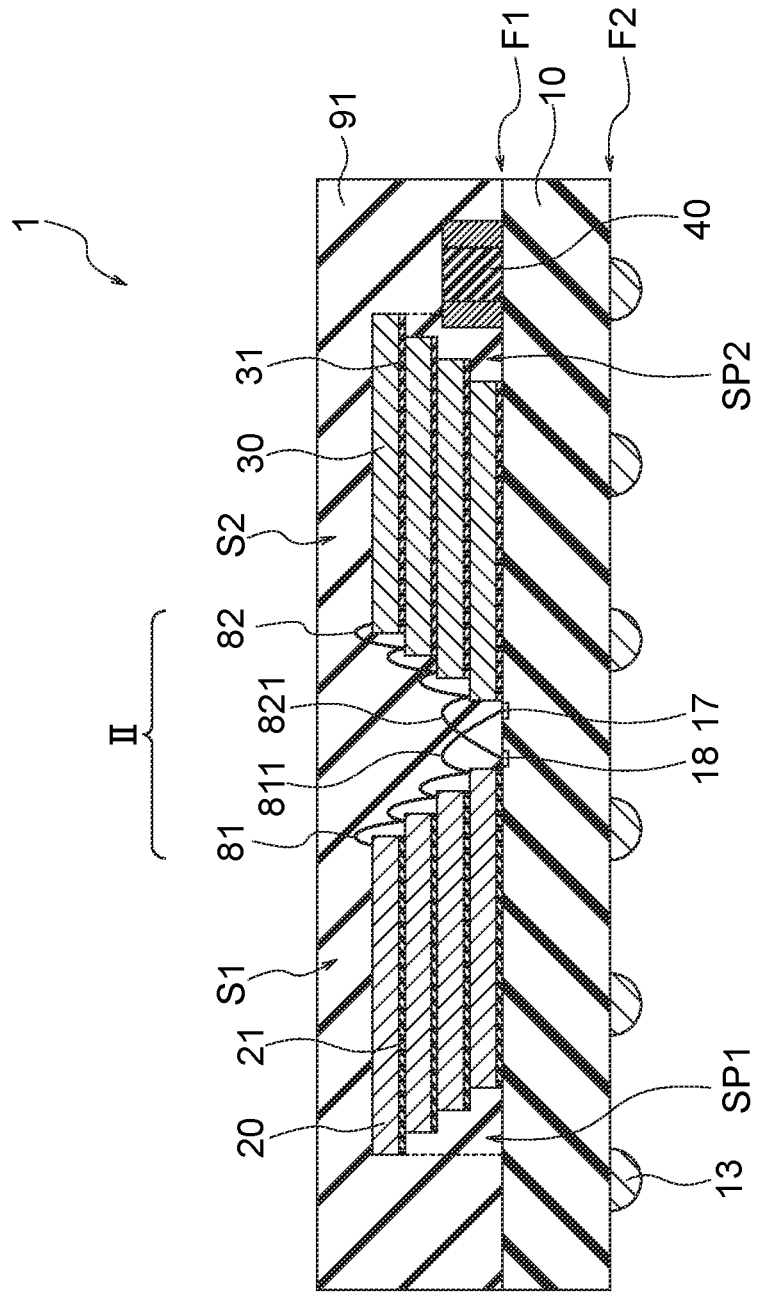
FIG. 1 is a sectional view showing an exemplary configuration of a semiconductor device according to a first embodiment.

Embodiments will now be explained with reference to the accompanying drawings. The present invention is not limited to the embodiments. It should be noted that the drawings are schematic or conceptual, and the relationship between the thickness and the width in each element and the ratio among the dimensions of elements do not necessarily match the actual ones. Even if two or more drawings show the same portion, the dimensions and the ratio of the portion may differ in each drawing. In the present specification and the drawings, elements identical to those described in the foregoing drawings are denoted by like reference characters and detailed explanations thereof are omitted as appropriate.

A semiconductor device according to an embodiment includes a substrate, a first semiconductor chip, a second semiconductor chip, a first wire and a second wire. The substrate includes a first surface. The first semiconductor chip is provided on the first surface. The second semiconductor chip is provided at a position on the first surface that is apart from the position of the first semiconductor chip in a first direction substantially parallel to the first surface. The first wire is electrically connected to the first semiconductor chip, and is provided to extend to the side of the second semiconductor chip. The second wire is electrically connected to the second semiconductor chip, and is provided to extend to the side of the first semiconductor chip. The first wire and the second wire cross as viewed in a third direction substantially perpendicular to both of the first direction and a second direction substantially perpendicular to the first surface.

First Embodiment

FIG. 1 is a sectional view showing an exemplary configuration of a semiconductor device 1 according to a first embodiment. The semiconductor device 1 includes a wiring substrate 10, stack bodies S1, S2, an electronic component 40, bonding wires 81, 82 and a seal resin 91. For example, the semiconductor device 1 is a package of a NAND flash memory.

FIG. 1 shows an X direction and a Y direction that are parallel to a surface of the substrate (wiring substrate 10) and that are perpendicular to each other, and a Z direction that is perpendicular to the surface of the substrate (wiring substrate 10). In the present specification, a +Z direction is treated as an upward direction, and a —Z direction is treated as a downward direction. The —Z direction may be the same as the gravity direction, or may be different from the gravity direction.

The wiring substrate 10 may be a print substrate or interposer that includes a wiring layer (not illustrated) and an insulation layer (not illustrated). For the wiring layer, for example, a low-resistance metal such as copper (Cu), nickel (Ni) or an alloy of them is used. For the insulation layer, for example, an insulation material such as a glass epoxy resin is used. The wiring substrate 10 may have a multi-layer wiring structure configured by stacking a plurality of wiring layers and a plurality of insulation layers. For example, the wiring substrate 10 may include a penetration electrode that penetrates the front surface and back surface of the wiring substrate 10, as in the case of an interposer.

A solder resist layer provided on the wiring layer is provided on the front surface (surface F1) of the wiring substrate 10. The solder resist layer protects the wiring layer, and is used for the insulation layer for restraining short-circuit defect. Pads 17, 18 are provided on the front surface of the wiring substrate 10. The pads 17, 18 are included in the wiring layer, and are exposed from the solder resist layer. The pad 17 is electrically connected to the stack body S1. The pad 18 is electrically connected to the stack body S2. For example, each of the pads 17, 18 is a gold (Au)-plated electrode.

A solder resist layer provided on the wiring layer is provided on the back surface (surface F2) of the wiring substrate 10. Metal bumps 13 are provided on the wiring layer exposed from the solder resist layer. The metal bumps 13 are provided for electrically connecting other unillustrated components and the wiring substrate 10.

The stack body S1 includes semiconductor chips 20 and adhesion layers 21. For example, the adhesion layer 21 is a DAF (Die Attachment Film). The stack body S1 is a stack body in which a plurality of semiconductor chips 20 is stacked to be shifted in a direction (for example, a −X direction) perpendicular to the stack direction (the Z direction). Further, the stack body S1 is provided on the surface F1.

For example, the semiconductor chip 20 is a memory chip that includes a NAND flash memory. The semiconductor chip 20 includes a semiconductor element (not illustrated) on the front surface (upper surface). For example, the semiconductor element may include a memory cell array and a peripheral circuit (CMOS (Complementary Metal Oxide Semiconductor) circuit) thereof. The memory cell array may be a solid memory cell array in which a plurality of memory cells is three-dimensionally disposed. In the figure, the semiconductor chips 20 as four memory chips are stacked. However, the stack number of semiconductor chips may be three or less or may be five or more.

The stack body S2 includes semiconductor chips 30 and adhesion layers 31. For example, the adhesion layer 31 is a DAF (Die Attachment Film). The stack body S2 is a stack body in which a plurality of semiconductor chips 30 is stacked to be shifted in a direction (for example, a +X direction) perpendicular to the stack direction (the Z direction). Further, the stack body S2 is provided at a position on the surface F1 that is apart from the position of the stack body S1 in the X direction substantially parallel to the surface F1.

For example, the semiconductor chip 30 is a memory chip that includes a NAND flash memory. The semiconductor chip 30 includes a semiconductor element (not illustrated) on the front surface (upper surface). For example, the semiconductor element may include a memory cell array and a peripheral circuit (CMOS circuit) thereof. The memory cell array may be a solid memory cell array in which a plurality of memory cells is three-dimensionally disposed. In the figure, the semiconductor chips 30 as four memory chips are stacked. However, the stack number of semiconductor chips may be three or less or may be five or more.

The bonding wires 81 are connected to freely-selected pads on the wiring substrate 10 and the semiconductor chips 20. The bonding wires 82 are connected to freely-selected pads on the wiring substrate 10 and the semiconductor chips 30. For example, each of the bonding wires 81, 82 is a gold (Au) wire. For the connection by the bonding wires 81, 82, the semiconductor chips 20, 30 are stacked to be shifted by a distance for pads 20*p*, 30*p* (see FIG. 2).

In the example shown in FIG. 1, the shift direction of the stack body S1 (the offset direction of the semiconductor chips 20) is the −X direction. The shift direction of the stack body S2 (the offset direction of the semiconductor chips 30) is the +X direction. The bonding wires 81 connected to the semiconductor chips 20 of the stack body S1 are provided on the side of the stack body S2. The bonding wires 82 connected to the semiconductor chips 30 of the stack body S2 are provided on the side of the stack body S1.

The bonding wire 81 electrically connects the stack body 51 and the wiring substrate 10. More specifically, the bonding wire 81 electrically connects the semiconductor chip 20 at the lowest stage and the pad 17. The bonding wire 81 electrically connects the semiconductor chips 20 to each other. The bonding wire 81 may connect the pad 17 on the substrate and a semiconductor chip 20 other than the semiconductor chip 20 at the lowest stage in the stack body S1.

The bonding wire 82 electrically connects the stack body S2 and the wiring substrate 10. More specifically, the bonding wire 82 electrically connects the semiconductor chip 30 at the lowest stage and the pad 18. The bonding wire 82 electrically connects the semiconductor chips 30 to each other. The bonding wire 82 may connect the pad 18 on the substrate and a semiconductor chip 30 other than the semiconductor chip 30 at the lowest stage in the stack body S2.

Hereinafter, among the plurality of bonding wires 81, a bonding wire 81 that electrically connects the semiconductor chip 20 and the pad 17 is referred to as a bonding wire 811. Similarly, among the plurality of bonding wires 82, a bonding wire 82 that electrically connects the semiconductor chip 30 and the pad 18 is referred to as a bonding wire 821.

More specifically, the bonding wire 811 is electrically connected to the semiconductor chip 20, and is provided to extend to the side of the stack body S2. The bonding wire 821 is electrically connected to the semiconductor chip 30, and is provided to extend to the side of the stack body S1. The bonding wire 811 is an example of the first wire. The bonding wire 821 is an example of the second wire.

The bonding wires 811, 821 cross as viewed in the Y direction substantially perpendicular to both of the X direction and the Z direction substantially perpendicular to the surface F1 (the bonding wires 811, 821 partially overlap). Thereby, a region between the pads 17, 18 on the wiring substrate 10 and the stack bodies S1, S2 can be shared (overlapped) between the stack bodies S1, S2. As a result, the package size can be further reduced. The Z direction is an example of the second direction. The Y direction is an example of the third direction.

The electronic component 40 is a component that is used for the operation of the semiconductor device 1. For example, the electronic component 40 includes a capacitor, a resistor and the like. The electronic component 40 is provided on the wiring substrate 10. Details of the disposition of the electronic component 40 will be described later.

Further, the seal resin 91 seals the stack bodies S1, S2, the electronic component 40, the bonding wires 81, 82 and the like. Thereby, the semiconductor device 1 is configured as one semiconductor package in which the stack bodies S1, S2 are placed on the wiring substrate 10.

Next, details of the bonding wires 81, 82 will be described.

Figure 2:
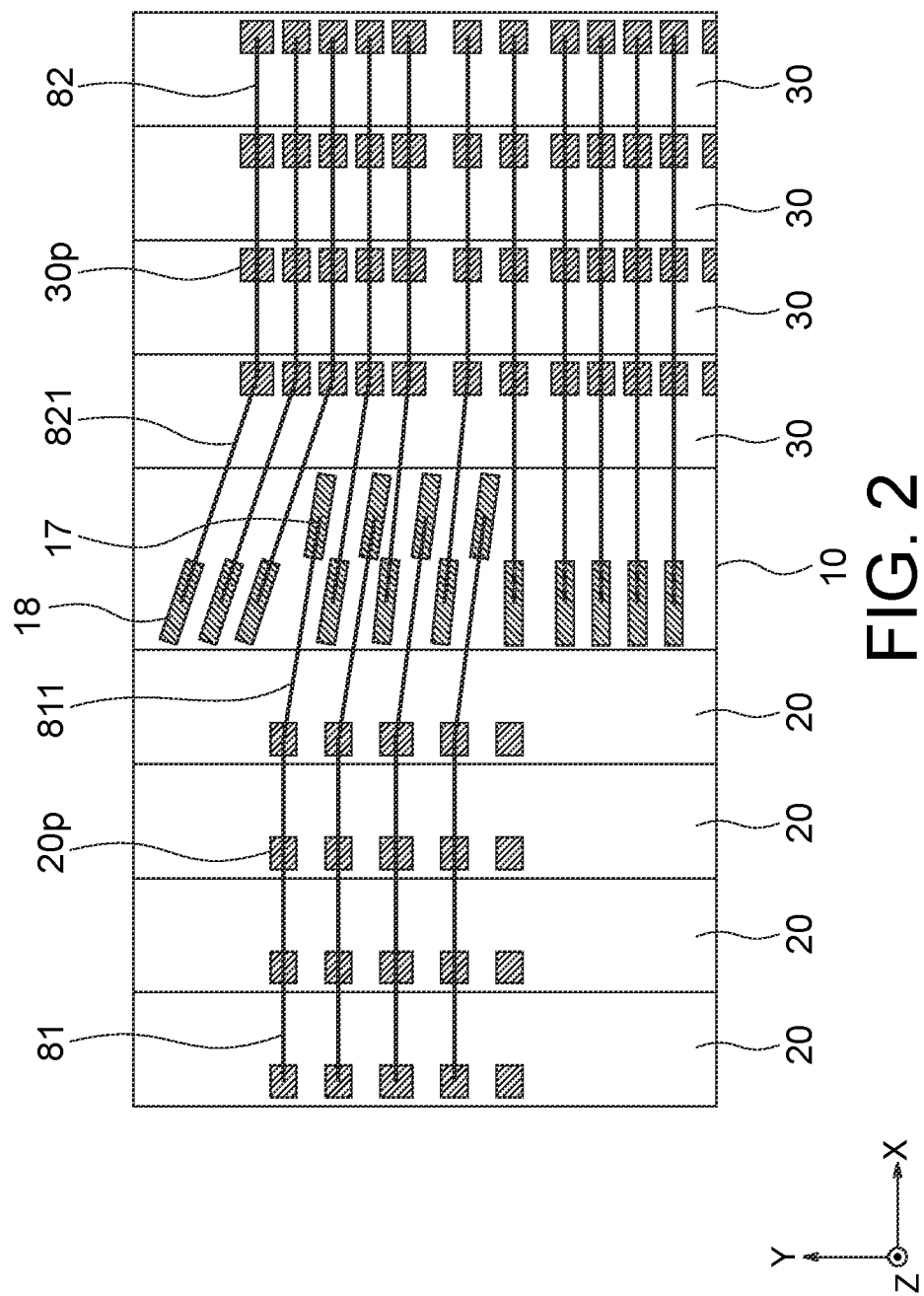
FIG. 2 is a top view showing an exemplary configuration of bonding wires and pads according to the first embodiment.

FIG. 2 is a top view showing an exemplary configuration of the bonding wires 81, 82 and the pads 17, 18 according to the first embodiment. FIG. 2 is a diagram of the bonding wires 81, 82 shown in FIG. 1 as viewed in the Z direction.

For example, the pads 17, 18 have a wiring form (finger form).

The pad 17 is disposed on the side of the stack body S2 (semiconductor chips 30). The pad 18 is disposed on the side of the stack body S1 (semiconductor chips 20). This allows the securement of a dotting interval that is necessary to form the bonding wires 81, 82. Accordingly, the distance between the semiconductor chip 20 at the lowest stage and the semiconductor chip 30 at the lowest stage is set depending on the dotting interval of the bonding wires 81, 82.

The disposition of the pads 17, 18 shown in FIG. 2 is an example. For example, at a position where pads 20p, 30p are relatively closely disposed, pads 17, 18 are alternately disposed along the Y direction. For example, each of the pads 20p, 30p is an aluminum (Al) electrode.

Figure 3:
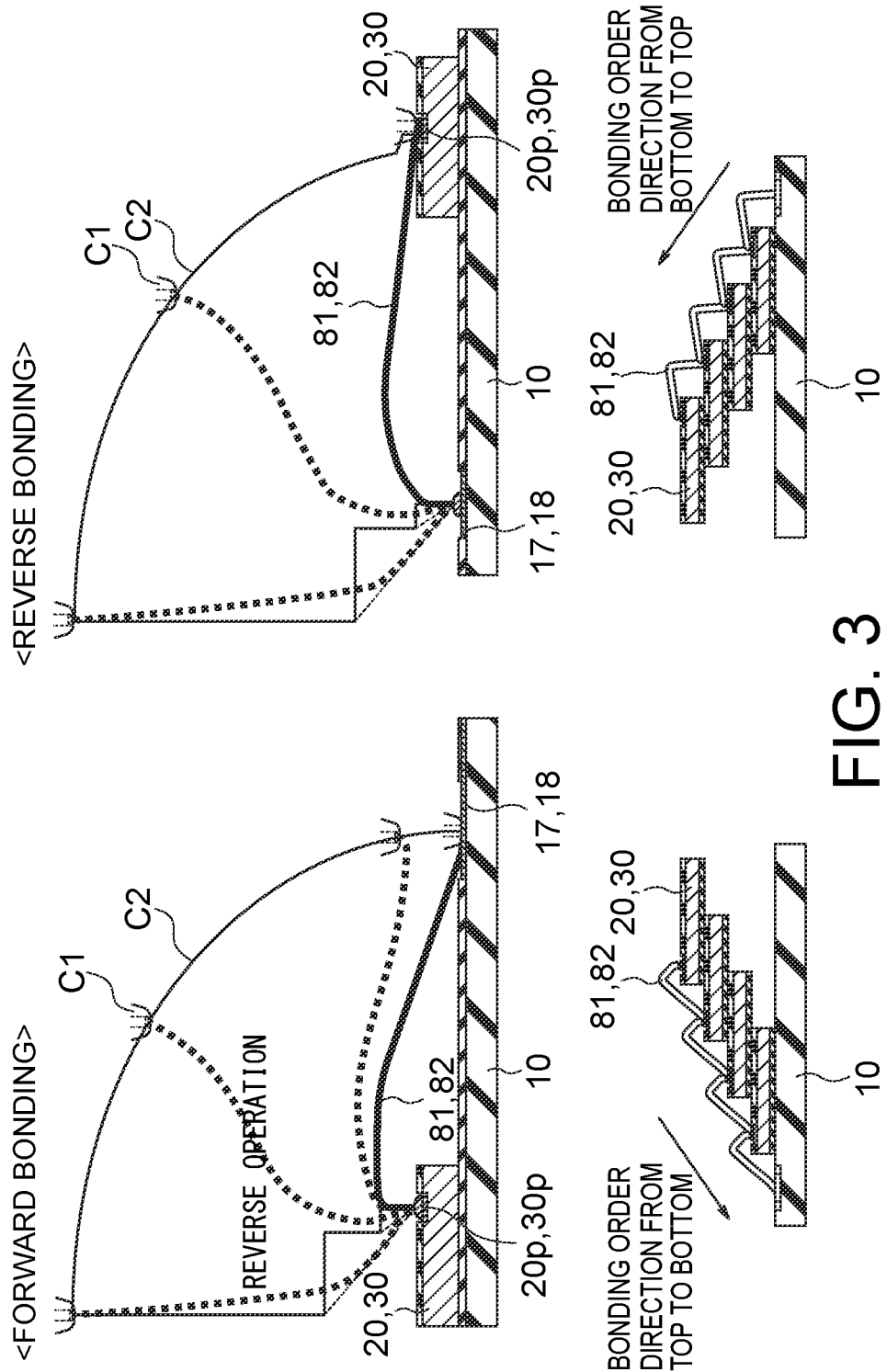
FIG. 3 is a diagram showing exemplary methods of bonding and exemplary forms of the bonding wire.

FIG. 3 is a diagram showing exemplary methods of bonding and exemplary forms of the bonding wire. The left side of FIG. 3 shows a forward bonding. The right side of FIG. 3 shows a reverse bonding. The upper side of FIG. 3 shows a trajectory C2 of a distal end of a capillary C1. The lower side of FIG. 3 shows the order of bonding.

In the forward bonding, a first bonding is performed on the side of the semiconductor chips 20, 30, that is, on the opposite side of the wiring substrate 10, and a second bonding is performed on the side of the wiring substrate 10. In the forward bonding, for forming the wire form, after the first bonding, the capillary C1 moves to the opposite side (the leftward direction on the sheet plane of FIG. 3) of the position of the second bonding.

As shown on the upper side of FIG. 3, the bonding wire 81, 82 includes a ball bonding portion at an end portion of first bonding (pad 20p, 30p), and includes a wedge bonding portion at an end portion of the second bonding (pad 17, 18).

Further, as shown on the lower side of FIG. 3, in the forward bonding, the plurality of bonding wires 81, 82 is formed in the order from the top to the bottom.

In the reverse bonding, the first bonding is performed on the side of the wiring substrate 10, and the second bonding is performed on the side of the semiconductor chips 20, 30, that is, on the opposite side of the wiring substrate 10. In the reverse bonding, for forming the wire form, after the first bonding, the capillary C1 moves to the opposite side (the leftward direction on the sheet plane of FIG. 3) of the position of the second bonding.

As shown on the upper side of FIG. 3, the bonding wire 81, 82 includes a ball bonding portion at an end portion of first bonding (pads 17, 18), and includes a wedge bonding portion at an end portion of the second bonding (pads 20p, 30p).

Further, as shown on the lower side of FIG. 3, in the reverse bonding, the plurality of bonding wires 81, 82 is formed in the order from the bottom to the top.

In the case of the reverse bonding, as described above, the capillary C1 moves to the opposite side (the leftward direction on the sheet plane of FIG. 3) of the semiconductor chips 20, 30. In this case, the capillary C1 can make contact with another semiconductor chip 20, 30, the electronic component or the like. Accordingly, it is preferable that the bonding wire 81, 82 be formed by the forward bonding. That is, it is preferable that the bonding wire 81, 82 include the ball bonding portion at the end portion on the opposite side of the wiring substrate 10 and include the wedge bonding portion at the end portion on the side of the wiring substrate 10. Thereby, the stack bodies S1, S2, the electronic component 40 and the like can be disposed to be closer to each other. As a result, the package size can be further reduced.

As described above, in the first embodiment, the bonding wires 811, 821 cross as viewed in the Y direction. The Y direction is a direction substantially perpendicular to both of the X direction and the Z direction. The X direction is a direction in which the stack bodies S1, S2 are arrayed. The Z direction is a direction substantially perpendicular to the surface F1 of the wiring substrate 10. Thereby, a necessary disposition area can be restrained, and the package size (area) can be further reduced.

Further, the electronic component 40 is disposed in at least a part of a space (under the eave) SP1 between the stack body S1 and the wiring substrate 10 and a space (under the eave) SP2 between the stack body S2 and the wiring substrate 10. In the example shown in FIG. 1, the electronic component 40 is disposed to be put into the space SP2. That is, the electronic component 40 is disposed to overlap with the stack body S2 as viewed in the Z direction. The spaces SP1, SP2 are formed on outsides that are opposite sides of the bonding wires 81, 82 provided at a central portion. Accordingly, another component and the like may be disposed in the spaces SP1, SP2. Thereby, the package size can be further reduced. The disposition of the electronic component 40 is not limited to the example shown in FIG. 1. Further, the electronic component 40 may be excluded.

The bonding wire 811 connected to the wiring substrate 10 (pad 17) is connected to the semiconductor chip 20 at the lowest stage. However, without being limited to this, the bonding wire 811 may be connected to a semiconductor chip 20 other than the semiconductor chip 20 at the lowest stage in the stack body S1. Further, the bonding wire 821 connected to the wiring substrate 10 (pad 18) is connected to the semiconductor chip 30 at the lowest stage. However, without being limited to this, the bonding wire 821 may be connected to a semiconductor chip 30 other than the semiconductor chip 30 at the lowest stage in the stack body S2.

Comparative Example

Figure 4:
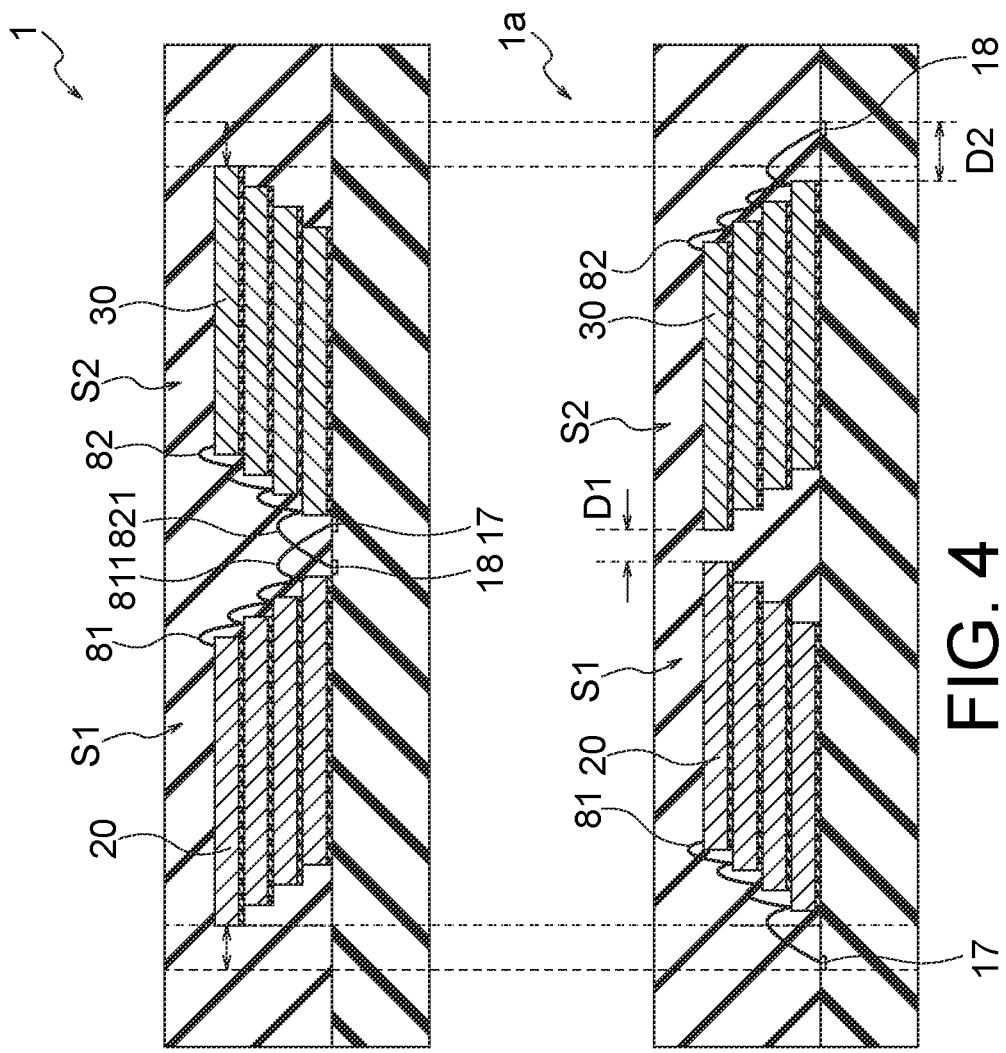
FIG. 4 is a sectional view showing an exemplary configuration of a semiconductor device according to a comparative example.

FIG. 4 is a sectional view showing an exemplary configuration of a semiconductor device 1a according to a comparative example. The upper side of FIG. 4 shows the semiconductor device 1 according to the first embodiment, and the lower side shows the semiconductor device 1*a* according to the comparative example. The metal bumps 13 are not illustrated.

In the comparative example, the shift direction of the stack body S1 is the +X direction. The shift direction of the stack body S2 is the −X direction. The bonding wire 81 connected to the semiconductor chip 20 of the stack body S1 is provided on the opposite side of the stack body S2. The bonding wire 82 connected to the semiconductor chip 30 of the stack body S2 is provided on the opposite side of the stack body S1. Accordingly, the bonding wires 81, 82 do not cross as viewed in the Y direction.

In the comparative example, an inter-chip distance D1 is the distance between the stack body S1 and the stack body S2. A finger region distance D2 is the distance between the semiconductor chip (chip end) at the lowest layer and the pad (pad end).

In the first embodiment, it is possible to partially share the inter-chip distance D1, the finger region distance D2 of the stack body S1 and the finger region distance D2 of the stack body S2. Thereby, it is possible to reduce the sum of the inter-chip distance D1 and the finger region distance D2. For example, it is possible to reduce a disposition distance of at most 710 μm, which is the sum of 300 μm of the inter-chip distance D1 and 410 μm of the finger region distance D2. As a result, the package size can be further reduced.

Second Embodiment

Figure 5:
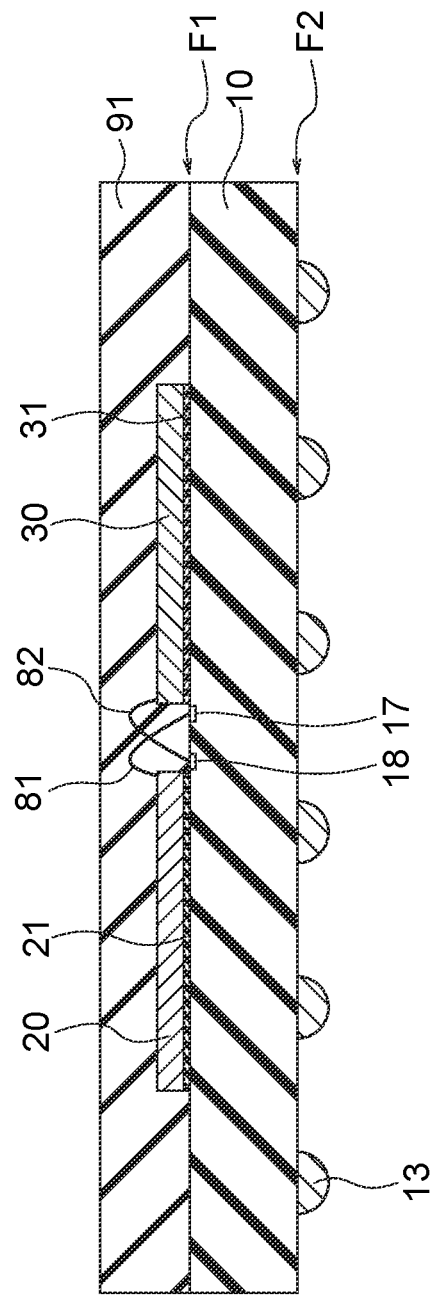
FIG. 5 is a sectional view showing an exemplary configuration of a semiconductor device according to a second embodiment.

FIG. 5 is a sectional view showing an exemplary configuration of a semiconductor device 1 according to a second embodiment. The second embodiment is different from the first embodiment in that the stack bodies S1, S2 are one-stage semiconductor chips 20, 30 respectively.

The semiconductor device 1 includes the one-stage semiconductor chip 20, the one-stage semiconductor chip 30, one bonding wire 81 and one bonding wire 82.

The bonding wires 81, 82 shown in FIG. 5 cross as viewed in the Y direction, as in the first embodiment described with reference to FIG. 1. Thereby, the package size can be further reduced.

The other configuration of the semiconductor device 1 according to the second embodiment is the same as the corresponding configuration of the semiconductor device 1 according to the first embodiment, and therefore the detailed description is omitted.

As in the case of the second embodiment, each of the stack numbers of the semiconductor chips 20, 30 may be one. The semiconductor device 1 according to the second embodiment can obtain the same effect as the effect of the first embodiment.

Third Embodiment

Figure 6:
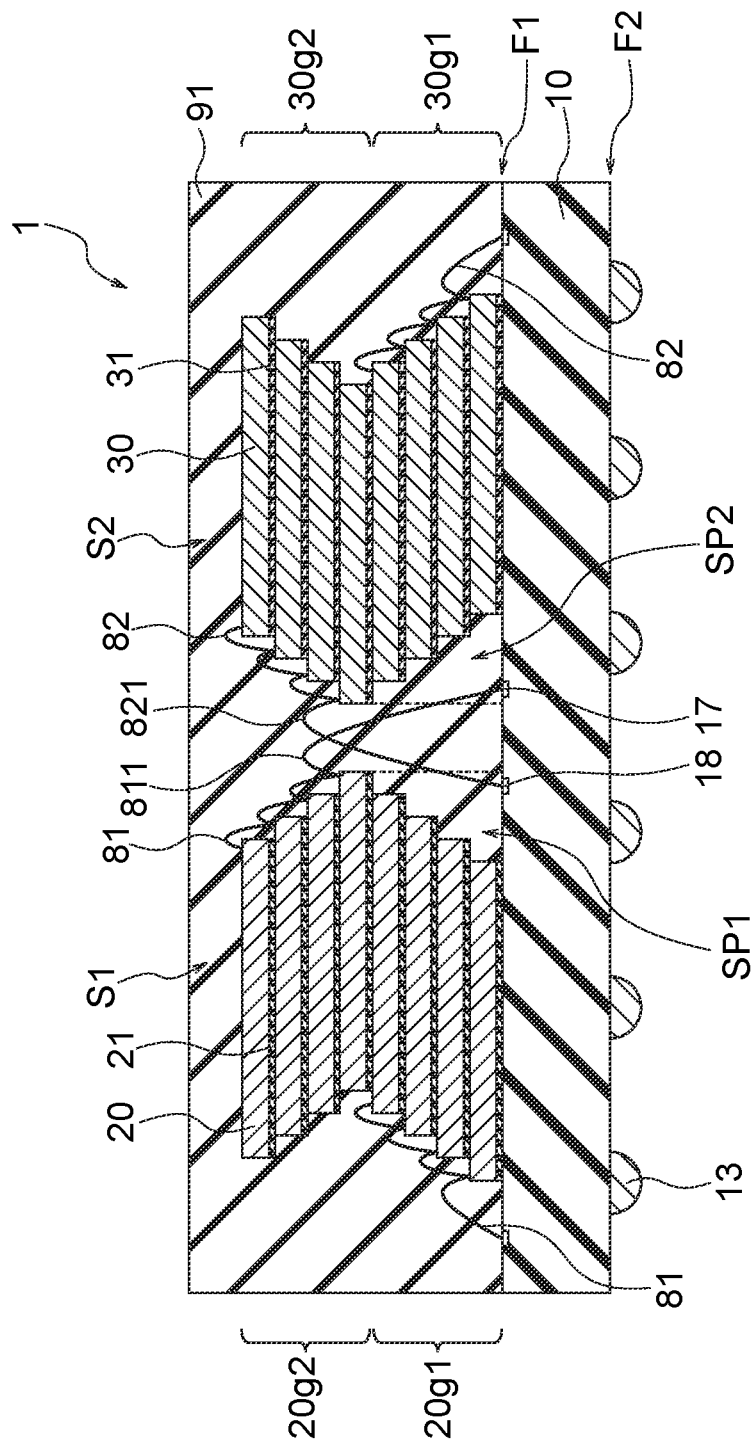
FIG. 6 is a sectional view showing an exemplary configuration of a semiconductor device according to a third embodiment.

FIG. 6 is a sectional view showing an exemplary configuration of a semiconductor device 1 according to a third embodiment. The third embodiment is different from the first embodiment in the stack number of the stack bodies S1, S2.

The stack body S1 includes chip groups 20*g*1, 20*g*2.

The chip group 20*g*1 is a chip group in which a plurality of semiconductor chips 20 is stacked to be shifted in a shift direction (offset direction) substantially parallel to the surface F1. For example, the chip group 20*g*1 includes four semiconductor chips 20. The chip group 20*g*1 is an example of the first chip group.

The chip group 20*g*2 is provided on the chip group 20*g*1. The chip group 20*g*2 is a chip group in which a plurality of semiconductor chips 20 is stacked to be shifted in the opposite direction of the shift direction of the chip group 20*g*1. For example, the chip group 20*g*2 includes four semiconductor chips 20. The chip group 20*g*2 is an example of the second chip group.

In the example shown in FIG. 6, the shift direction of the chip group 20*g*1 is the +X direction. The shift direction of the chip group 20*g*2 is the −X direction. The bonding wires 81 connected to the semiconductor chips of the chip group 20*g*1 are provided on the opposite side of the stack body S2. The bonding wires 81 connected to the semiconductor chips 20 of the chip group 20*g*2 are provided on the side of the stack body S2.

The stack body S2 includes chip groups 30*g*1, 30*g*2.

The chip group 30*g*1 is a chip group in which a plurality of semiconductor chips 30 is stacked to be shifted in a shift direction substantially parallel to the surface F1. For example, the chip group 30*g*1 includes four semiconductor chips 30. The chip group 30*g*1 is an example of the third chip group.

The chip group 30*g*2 is provided on the chip group 30*g*1. The chip group 30*g*2 is a chip group in which a plurality of semiconductor chips 30 is stacked in the opposite direction of the shift direction of the chip group 30*g*1. For example, the chip group 30*g*2 includes four semiconductor chips 30. The chip group 30*g*2 is an example of the fourth chip group.

In the example shown in FIG. 6, the shift direction of the chip group 30*g*1 is the −X direction. The shift direction of the chip group 30*g*2 is the +X direction. The bonding wires 82 connected to the semiconductor chips 30 of the chip group 30*g*1 are provided on the opposite side of the stack body S1. The bonding wires 82 connected to the semiconductor chip 30 of the chip group 30*g*2 are provided on the side of the stack body S1.

The bonding wires 811, 821 shown in FIG. 6 cross as viewed in the Y direction. Thereby, the package size can be further reduced.

Further, the space SP1 is between the stack body S1 and the wiring substrate 10. The space SP2 is between the stack body S2 and the wiring substrate 10.

The bonding wire 811 extends to reach the space SP2. The bonding wire 811 is connected to the pad 17 in the space SP2. That is, the pad 17 and the bonding wire 811 connected to the pad 17 overlap with the stack body S2 as viewed in the Z direction. Thereby, the package size can be further reduced.

The bonding wire 821 extends to reach the space SP1. The bonding wire 821 is connected to the pad 18 in the space SP1. That is, the pad 18 and the bonding wire 821 connected to the pad 18 overlap with the stack body S1 as viewed in the Z direction. Thereby, the package size can be further reduced.

The shift direction of the chip group 20*g*1 is the direction to the side of the stack body S2. The shift direction of the chip group 30*g*1 is the direction to the side of the stack body S1. In this case, as shown in FIG. 6, a shape resulting from coupling the side shape of the stack body S1 on the side of the stack body S2 and the side shape of the stack body S2 on the side of the stack body S1 is a substantially X-shape. In this case, the bonding wire 811 can be easily put into the space SP2, and similarly, the bonding wire 821 can be easily put into the space SP1.

The bonding wire 811 is connected to the semiconductor chip 20 at the lowest stage in the chip group 20*g*2. However, without being limited to this, for example, the bonding wire 811 may be connected to a semiconductor chip 20 other than the semiconductor chip 20 at the lowest stage in the chip group 20g2. Further, the bonding wire 821 is connected to the semiconductor chip 30 at the lowest stage in the chip group 30g2. However, without being limited to this, for example, the bonding wire 821 may be connected to a semiconductor chip 30 other than the semiconductor chip 30 at the lowest stage in the chip group 30g2.

As in the case of the third embodiment, the stack number of the stack bodies S1, S2 may be altered. The semiconductor device 1 according to the third embodiment can obtain the same effect as the effect of the first embodiment.

Fourth Embodiment

Figure 7:
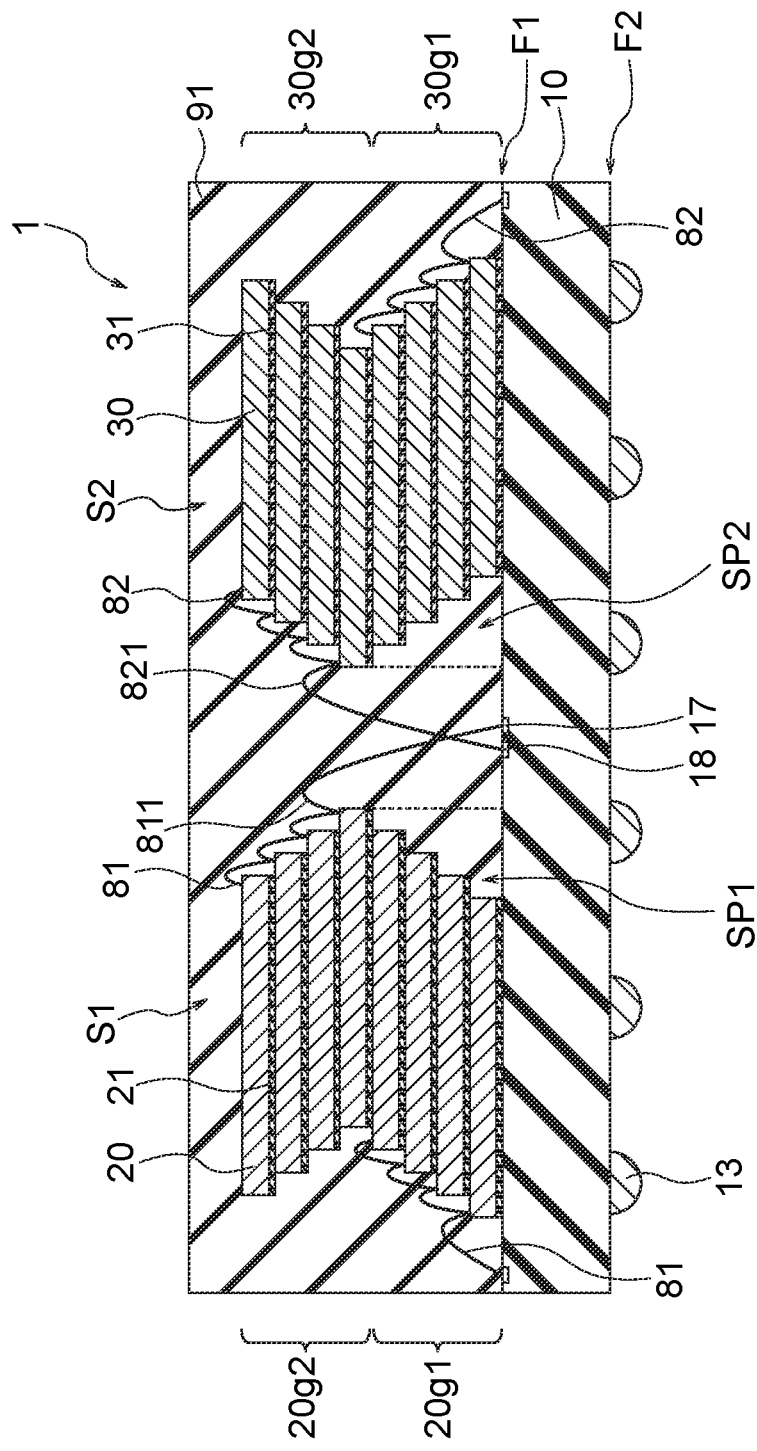
FIG. 7 is a sectional view showing an exemplary configuration of a semiconductor device according to a fourth embodiment.

FIG. 7 is a sectional view showing an exemplary configuration of a semiconductor device 1 according to a fourth embodiment. The fourth embodiment is different from the third embodiment in the position relation between the bonding wires 81, 82 and the spaces SP1, SP2.

In the example shown in FIG. 7, the bonding wire 811 does not reach the space SP2. The bonding wire 821 does not reach the space SP1.

The other configuration of the semiconductor device 1 according to the fourth embodiment is the same as the corresponding configuration of the semiconductor device 1 according to the third embodiment, and therefore the detailed description is omitted.

As in the case of the fourth embodiment, the position relation between the bonding wires 81, 82 and the spaces SP1, SP2 may be altered. The semiconductor device 1 according to the fourth embodiment can obtain the same effect as the effect of the third embodiment.

Fifth Embodiment

Figure 8:
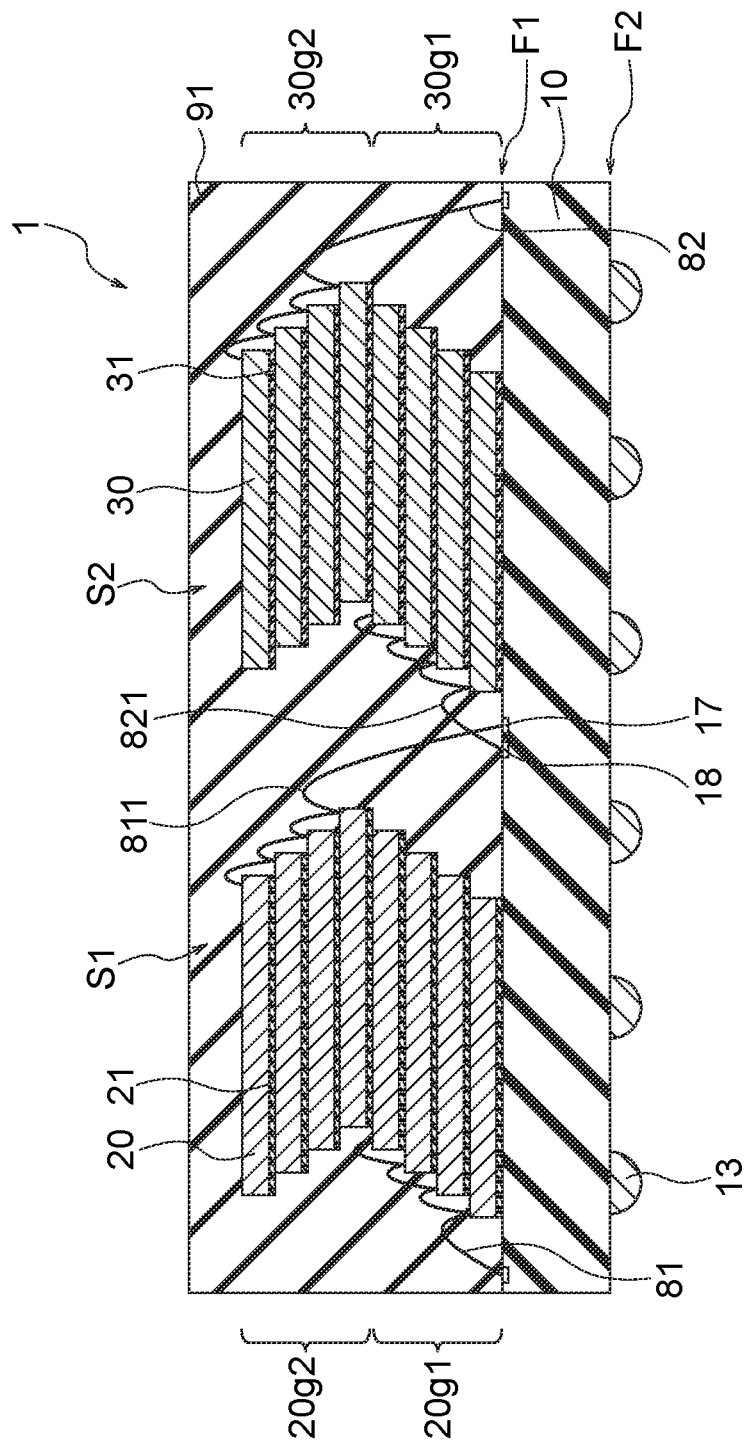
FIG. 8 is a sectional view showing an exemplary configuration of a semiconductor device according to a fifth embodiment.

FIG. 8 is a sectional view showing an exemplary configuration of a semiconductor device 1 according to a fifth embodiment. The fifth embodiment is different from the third embodiment in the shift direction of the semiconductor chips 30 in the stack body S2.

In the example shown in FIG. 8, the shift direction of the chip group 30g1 is the +X direction. The shift direction of the chip group 30g2 is the −X direction. The bonding wires 82 connected to the semiconductor chips 30 of the chip group 30g1 are provided on the side of the stack body S1. The bonding wires 82 connected to the semiconductor chips 30 of the chip group 30g2 are provided on the opposite side of the stack body S1.

Further, the shift direction of the semiconductor chips is the same between the stack body S1 and the stack body S2.

The other configuration of the semiconductor device 1 according to the fifth embodiment is the same as the corresponding configuration of the semiconductor device 1 according to the third embodiment, and therefore the detailed description is omitted.

As in the case of the fifth embodiment, the shift direction of the semiconductor chips may be altered. The semiconductor device 1 according to the fifth embodiment can obtain the same effect as the effect of the third embodiment.

Sixth Embodiment

Figure 9:
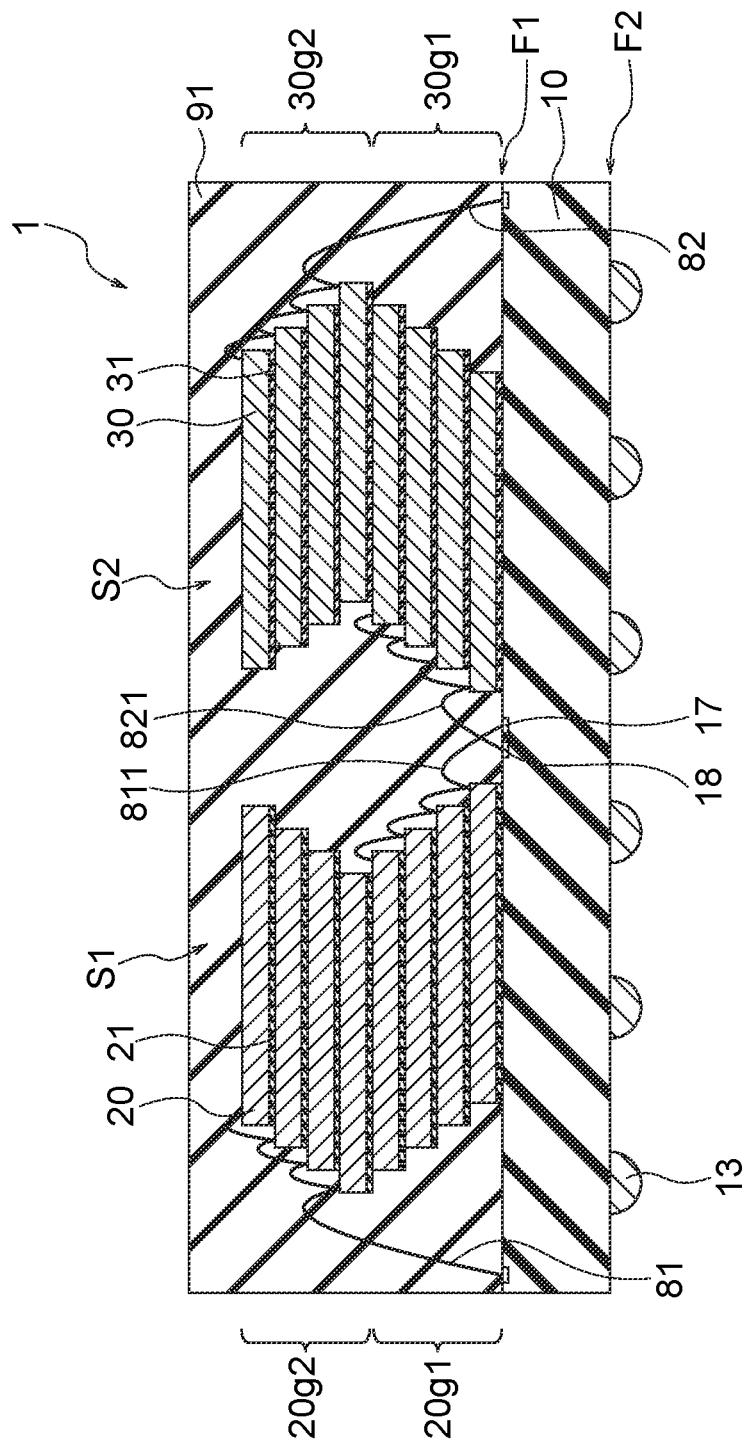
FIG. 9 is a sectional view showing an exemplary configuration of a semiconductor device according to a sixth embodiment.

FIG. 9 is a sectional view showing an exemplary configuration of a semiconductor device 1 according to a sixth embodiment. The sixth embodiment is different from the third embodiment in the shift directions of the semiconductor chips 20, 30 in the stack bodies S1, S2.

In the example shown in FIG. 9, the shift direction of the chip group 20g1 is the −X direction. The shift direction of the chip group 20g2 is the +X direction. The bonding wires 81 connected to the semiconductor chips 20 of the chip group 20g1 are provided on the side of the stack body S2. The bonding wires 81 connected to the semiconductor chips 20 of the chip group 20g2 are provided on the opposite side of the stack body S2.

In the example shown in FIG. 9, the shift direction of the chip group 30g1 is the +X direction. The shift direction of the chip group 30g2 is the −X direction. The bonding wires 82 connected to the semiconductor chips 30 of the chip group 30g1 are provided on the side of the stack body S1. The bonding wires 82 connected to the semiconductor chips 30 of the chip group 30g2 are provided on the opposite side of the stack body S1.

The other configuration of the semiconductor device 1 according to the sixth embodiment is the same as the corresponding configuration of the semiconductor device 1 according to the third embodiment, and therefore the detailed description is omitted.

As in the case of the sixth embodiment, the shift directions of the semiconductor chips may be altered. The semiconductor device 1 according to the sixth embodiment can obtain the same effect as the effect of the third embodiment.

Seventh Embodiment

Figure 10A:
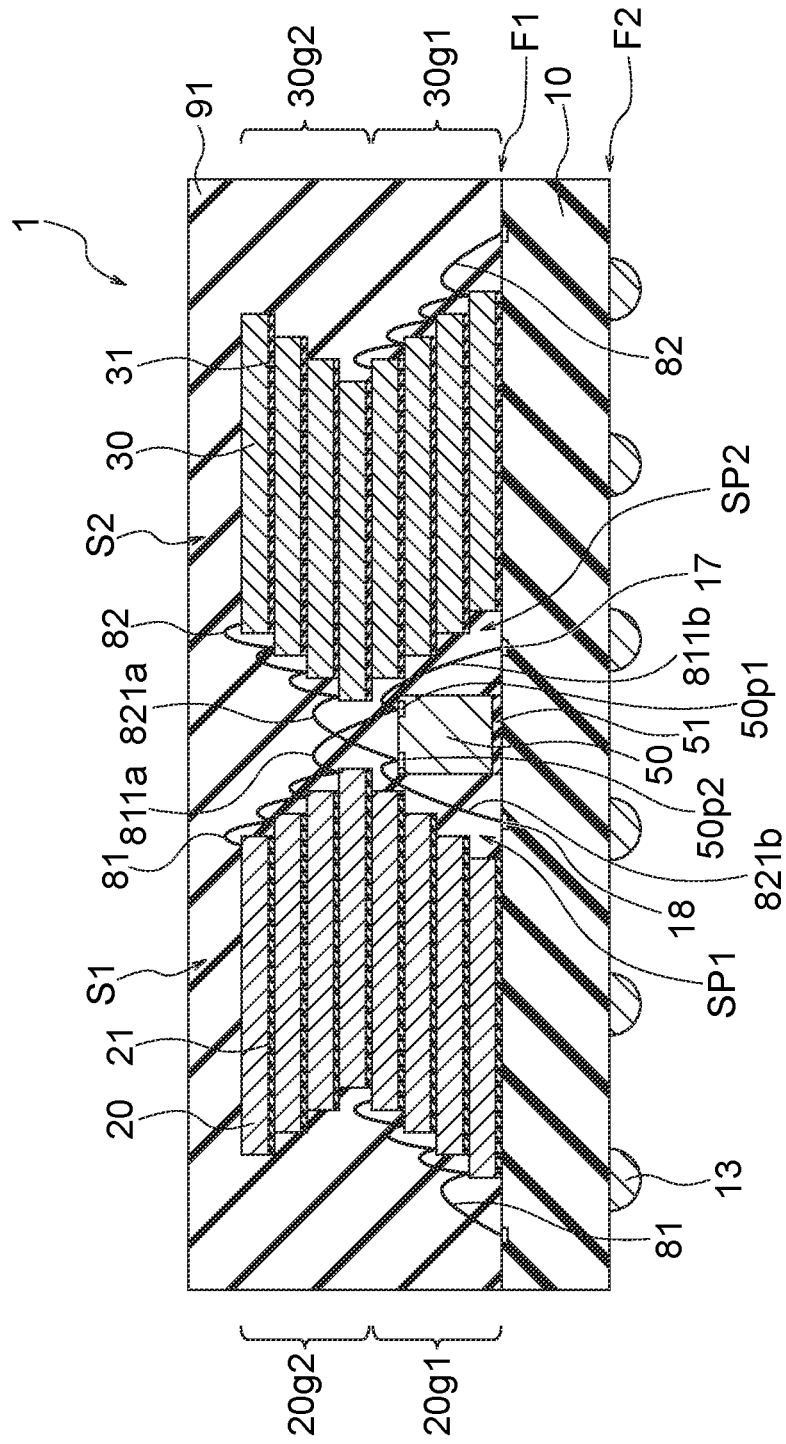
FIG. 10A is a sectional view showing an exemplary configuration of a semiconductor device according to a seventh embodiment.

FIG. 10A is a sectional view showing an exemplary configuration of a semiconductor device 1 according to a seventh embodiment. FIG. 10B is a top view showing an exemplary configuration of the semiconductor device 1 according to the seventh embodiment. FIG. 10B is a diagram of a relay chip 50 shown in FIG. 10A as viewed in the Z direction. The seventh embodiment is different from the third embodiment in that the relay chip 50 is further provided.

The semiconductor device 1 further includes the relay chip 50 and an adhesion layer 51.

The relay chip 50 is provided between the stack body S1 and the stack body S2. The relay chip 50 includes pads 50p1, 50p2 on the upper surface. The pads 50p1, 50p2 are electrically connected to the wiring substrate 10. The relay chip 50 adheres to the surface F1 through the adhesion layer 51.

For example, the relay chip 50 is a silicon chip. For example, the relay chip 50 may be a member provided with a metal pattern that is electrically connected to the wiring substrate 10. For example, the material of the member may be glass, resin or the like.

The bonding wire 811 includes a bonding wire 811a and a bonding wire 811b.

The bonding wire 811a electrically connects the semiconductor chip 20 and the pad 50p1. The bonding wire 811a is an example of the first wire.

The bonding wire 811b electrically connects the pad 50p1 and the pad 17. The bonding wire 811b is an example of the third wire.

The bonding wire 821 includes a bonding wire 821a and the bonding wire 821b.

The bonding wire 821a electrically connects the semiconductor chip 30 and the pad 50p2. The bonding wire 821a is an example of the second wire.

The bonding wire 821b electrically connects the pad 50p2 and the pad 18. The bonding wire 821b is an example of the fourth wire.

The bonding wires 811a, 821a shown in FIG. 10A and FIG. 10B cross as viewed in the Y direction. Thereby, the package size can be further reduced.

The bonding wire 811b extends to reach the space SP2. The bonding wire 811b is connected to the pad 17 in the space SP2. The bonding wire 821b extends to reach the space SP1. The bonding wire 821b is connected to the pad 18 in the space SP1. Thereby, the package size can be further reduced.

For example, the relay chip 50 may include a penetration electrode that electrically connects the pads 50p1, 50p2 and the wiring substrate 10. In this case, for example, the relay chip 50 is connected to the wiring substrate 10 by flip chip interconnection. Further, the bonding wires 811b, 821b may be excluded.

The other configuration of the semiconductor device 1 according to the seventh embodiment is the same as the corresponding configuration of the semiconductor device 1 according to the third embodiment, and therefore the detailed description is omitted.

Next, a manufacturing method of the semiconductor device 1 will be described.

Figure 11B:
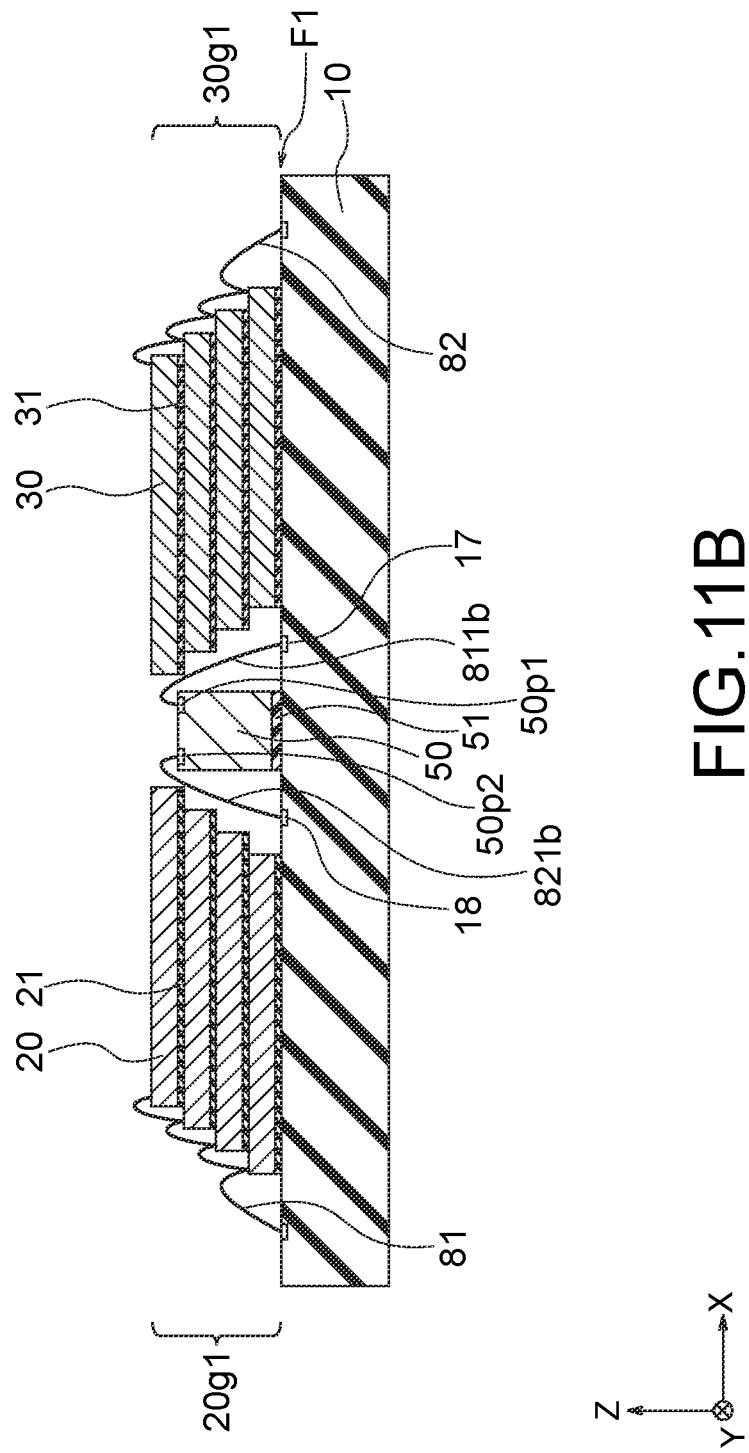
FIG. 11B is a sectional view showing the exemplary manufacturing method of the semiconductor device, and follows FIG. 11A.
Figure 11C:
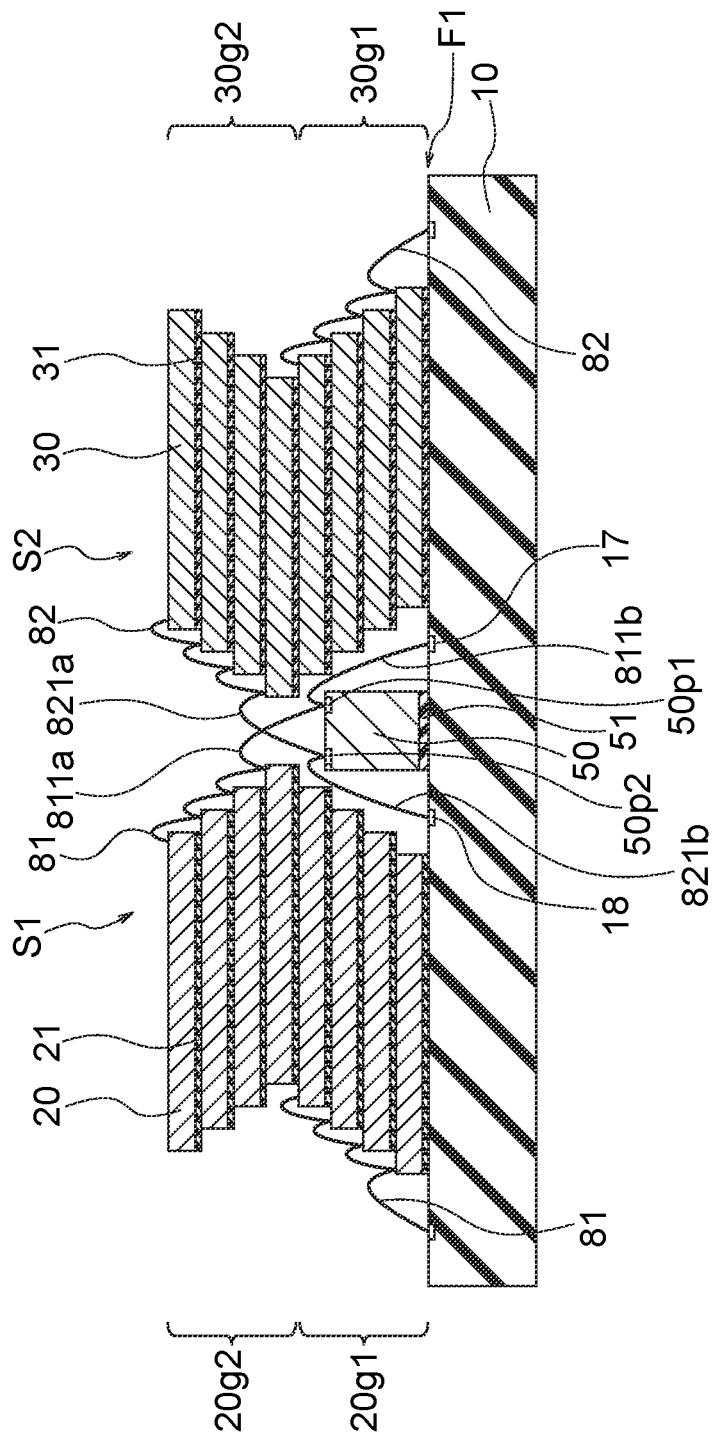
FIG. 11C is a sectional view showing the exemplary manufacturing method of the semiconductor device, and follows FIG. 11B.

FIG. 11A to FIG. 11C are sectional views showing an exemplary manufacturing method of the semiconductor device 1 according to the seventh embodiment.

First, as shown in FIG. 11A, the relay chip 50 is provided on the surface F1 through the adhesion layer 51. The relay chip 50 includes the pads 50p1, 50p2 on the upper surface. Thereafter, the bonding wires 81, 82 are formed. That is, the bonding wire 811b electrically connecting the pad 50p1 and the pad 17 and the bonding wire 821b electrically connecting the pad 50p2 and the pad 18 are formed.

Next, as shown in FIG. 11B, the chip groups 20g1, 30g1 are provided on both sides of the relay chip 50 along the X direction substantially parallel to the surface F1. Thereafter, the bonding wires 81, 82 electrically connected to the chip groups 20g1, 30g1 respectively are formed.

Next, as shown in FIG. 11C, the chip groups 20g2, 30g2 are provided on the chip groups 20g1, 30g1. Thereby, the stacks S1, S2 are formed. Thereafter, the bonding wires 81, 82 electrically connected to the chip groups 20g2, 30g2 respectively are formed. That is, the bonding wire 811a electrically connecting the stack body S1 (chip group 20g2) and the pad 50p1 and the bonding wire 821a electrically connecting the stack body S2 (chip group 30g2) and the pad 50p2 are formed.

Thereafter, the seal resin 91 is formed, and thereby, the semiconductor device 1 shown in FIG. 10A and FIG. 1013 is completed.

As in the case of the seventh embodiment, the relay chip 50 may be provided. The semiconductor device 1 according to the seventh embodiment can obtain the same effect as the effect of the third embodiment.

First Modification of Seventh Embodiment

Figure 12A:
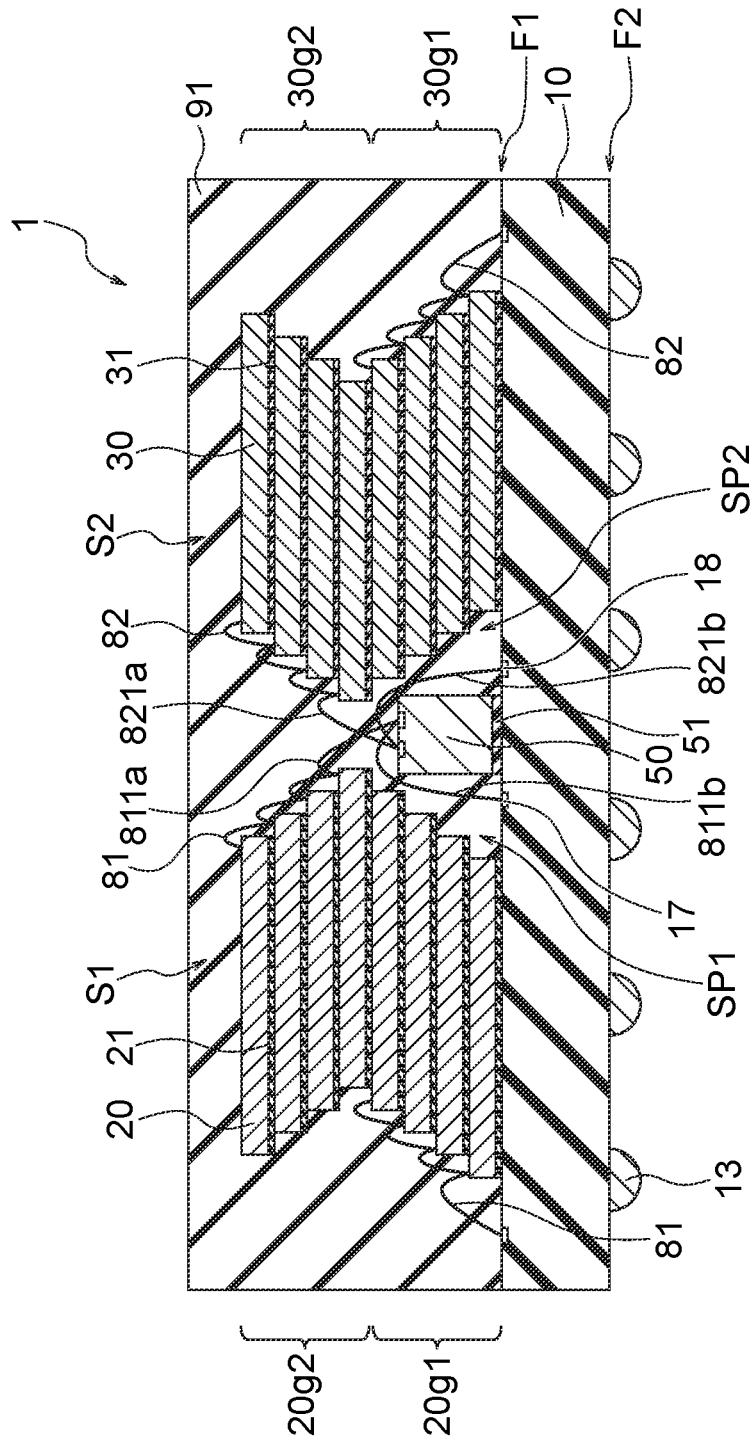
FIG. 12A is a sectional view showing an exemplary configuration of a semiconductor device according to a first modification of the seventh embodiment.
Figure 12B:
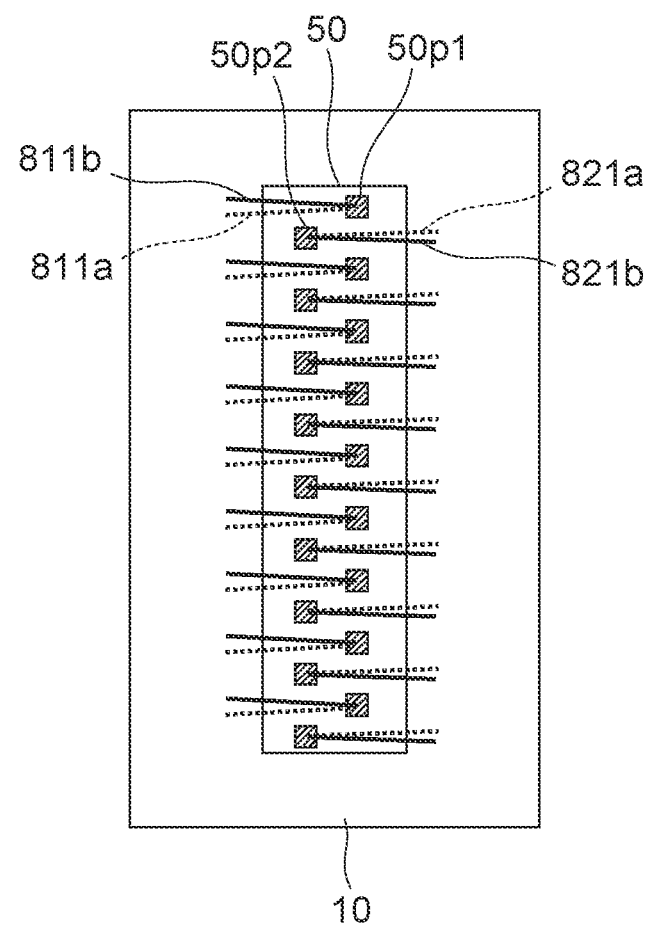
FIG. 12B is a top view showing the exemplary configuration of the semiconductor device according to the first modification of the seventh embodiment.

FIG. 12A is a sectional view showing an exemplary configuration of a semiconductor device 1 according to a first modification of the seventh embodiment. FIG. 12B is a top view showing the exemplary embodiment of the semiconductor device 1 according to the first modification of the seventh embodiment. FIG. 12B is a diagram of the relay chip 50 shown in FIG. 12A as viewed in the Z direction. The first modification of the seventh embodiment is different from the seventh embodiment in the wiring configuration in the periphery of the relay chip 50.

In the example shown in FIG. 12A and FIG. 12B, the bonding wire 811b extends from the pad 50p1 to the stack body S1. The bonding wire 812b extends from the pad 50p2 to the stack body S2.

In the first modification of the seventh embodiment, the bonding wire 811b extends to reach the space SP1. The bonding wire 811b is connected to the pad 17 in the space SP1. The bonding wire 821b extends to reach the space SP2. The bonding wire 821b is connected to the pad 18 in the space SP2. Thereby, the package size can be further reduced.

The other configuration of the semiconductor device 1 according to the first modification of the seventh embodiment is the same as the corresponding configuration of the semiconductor device 1 according to the seventh embodiment, and therefore the detailed description is omitted.

As in the case of the first modification of the seventh embodiment, the wiring configuration in the periphery of the relay chip 50 may be altered. The semiconductor device 1 according to the first modification of the seventh embodiment can obtain the same effect as the effect of the seventh embodiment.

Second Modification of Seventh Embodiment

Figure 13A:
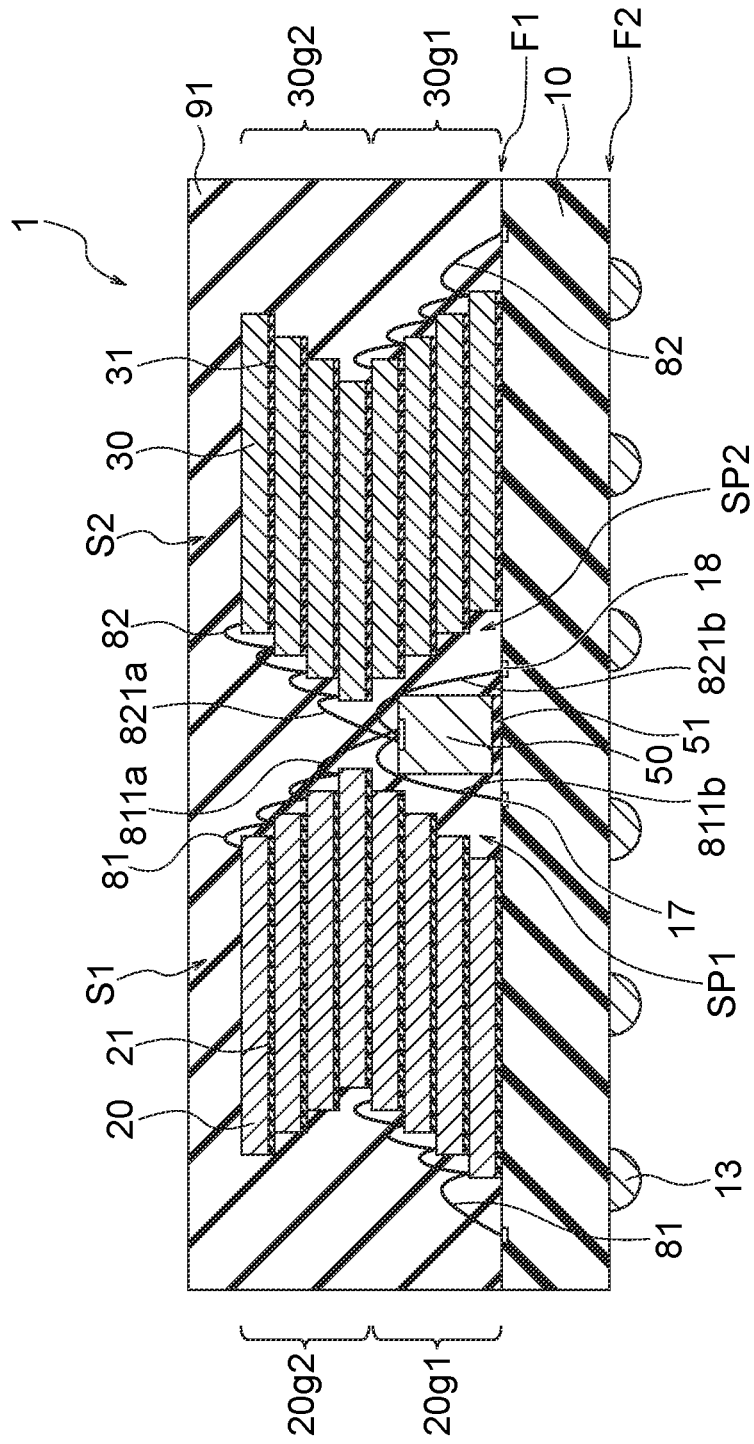
FIG. 13A is a sectional view showing an exemplary configuration of a semiconductor device according to a second modification of the seventh embodiment.
Figure 13B:
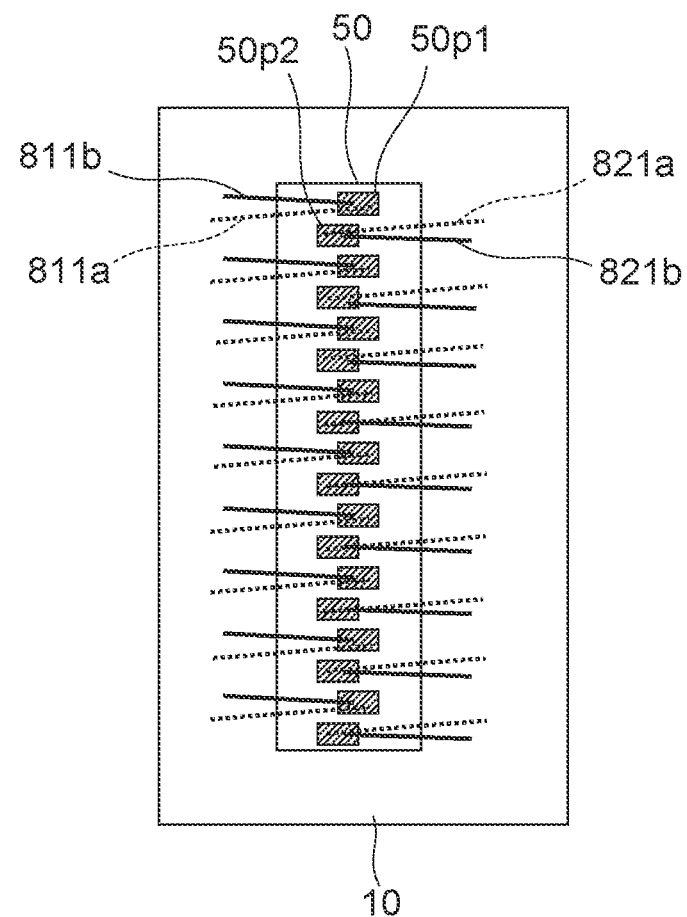
FIG. 13B is a top view showing the exemplary configuration of the semiconductor device according to the second modification of the seventh embodiment.

FIG. 13A is a sectional view showing an exemplary configuration of a semiconductor device 1 according to a second modification of the seventh embodiment. FIG. 13B is a top view showing the exemplary configuration of the semiconductor device 1 according to the second modification of the seventh embodiment. FIG. 13B is a diagram of the relay chip 50 shown in FIG. 13A as viewed in the Z direction. The second modification of the seventh embodiment is different from the first modification of the seventh embodiment in the configuration of the pads 50p1, 50p2.

In the example shown in FIG. 13A and FIG. 13B, for example, the pads 50p1, 50p2 have a rectangular shape. The length of the pads 50p1, 50p2 in the X direction is longer than the length of the pads 50p1, 50p2 in the Y direction. For example, the pads 50p1, 50p2 overlap as viewed in the Y direction. Since the pad 50p1 has a shape that is long in the X direction, the bonding positions of the bonding wires 811a, 811b can be shifted in the X direction. Since the pad 50p2 has a shape that is long in the X direction, the bonding positions of the bonding wires 821a, 821b can be shifted in the X direction.

The other configuration of the semiconductor device 1 according to the second modification of the seventh embodiment is the same as the corresponding configuration of the semiconductor device 1 according to the first modification of the seventh embodiment, and therefore the detailed description is omitted.

As in the case of the second modification of the seventh embodiment, the configuration of the pads 50p1, 50p2 may be altered. The semiconductor device 1 according to the second modification of the seventh embodiment can obtain the same effect as the effect of the first modification of the seventh embodiment.

Third Modification of Seventh Embodiment

Figure 14A:
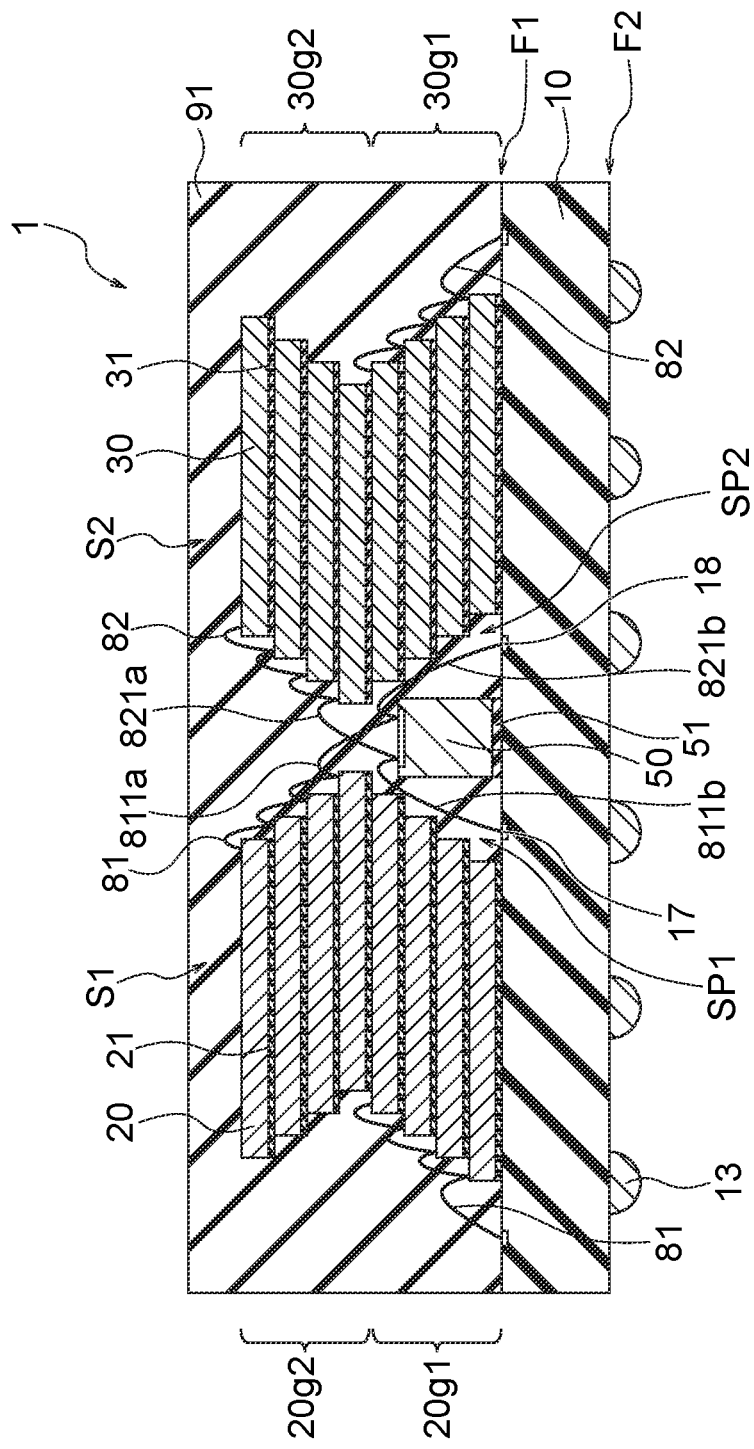
FIG. 14A is a sectional view showing an exemplary configuration of a semiconductor device according to a third modification of the seventh embodiment.
Figure 14B:
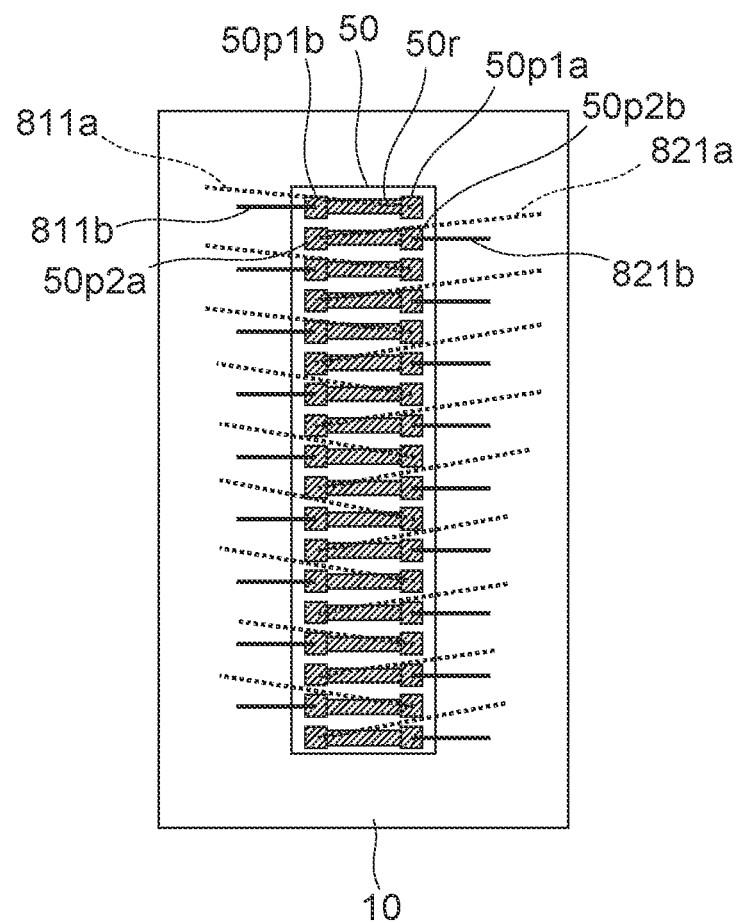
FIG. 14B is a top view showing the exemplary configuration of the semiconductor device according to the third modification of the seventh embodiment.

FIG. 14A is a sectional view showing an exemplary configuration of a semiconductor device 1 according to a third modification of the seventh embodiment. FIG. 14B is a top view showing the exemplary configuration of the semiconductor device 1 according to the third modification of the seventh embodiment. FIG. 14B is a diagram of the relay chip 50 shown in FIG. 14A as viewed in the Z direction. The third modification of the seventh embodiment is different from the seventh embodiment in the wiring structure in the periphery of the relay chip 50.

The pad 50$p1$ includes pads 50$p1a$, 50$p1b$. The pad 50$p2$ includes pads 50$p2a$, 50$p2b$.

The relay chip 50 further includes wirings 50$r$. The wiring 50$r$ electrically connects the pad 50$p1a$ and the pad 50$p1b$. Further, the wiring 50$r$ electrically connects the pad 50$p2a$ and the pad 50$p2b$. For example, the wiring 50$r$ is a rewiring.

The bonding wire 811$a$ electrically connects the semiconductor chip and the pad 50$p1a$.

The bonding wire 811$b$ electrically connects the pad 50$p1b$ and the pad 17.

The bonding wire 821$a$ electrically connects the semiconductor chip 30 and the pad 50$p2a$.

The bonding wire 821$b$ electrically connects the pad 50$p2b$ and the pad 18.

In the third modification of the seventh embodiment, the bonding wire 811$b$ extends to reach the space SP1. The bonding wire 811$b$ is connected to the pad 17 in the space SP1. The bonding wire 821$b$ extends to reach the space SP2. The bonding wire 821$b$ is connected to the pad 18 in the space SP2. Thereby, the package size can be further reduced.

As in the case of the third modification of the seventh embodiment, the wiring configuration in the periphery of the relay chip 50 may be altered. The semiconductor device 1 according to the third modification of the seventh embodiment can obtain the same effect as the effect of the seventh embodiment.

Eighth Embodiment

Figure 15:
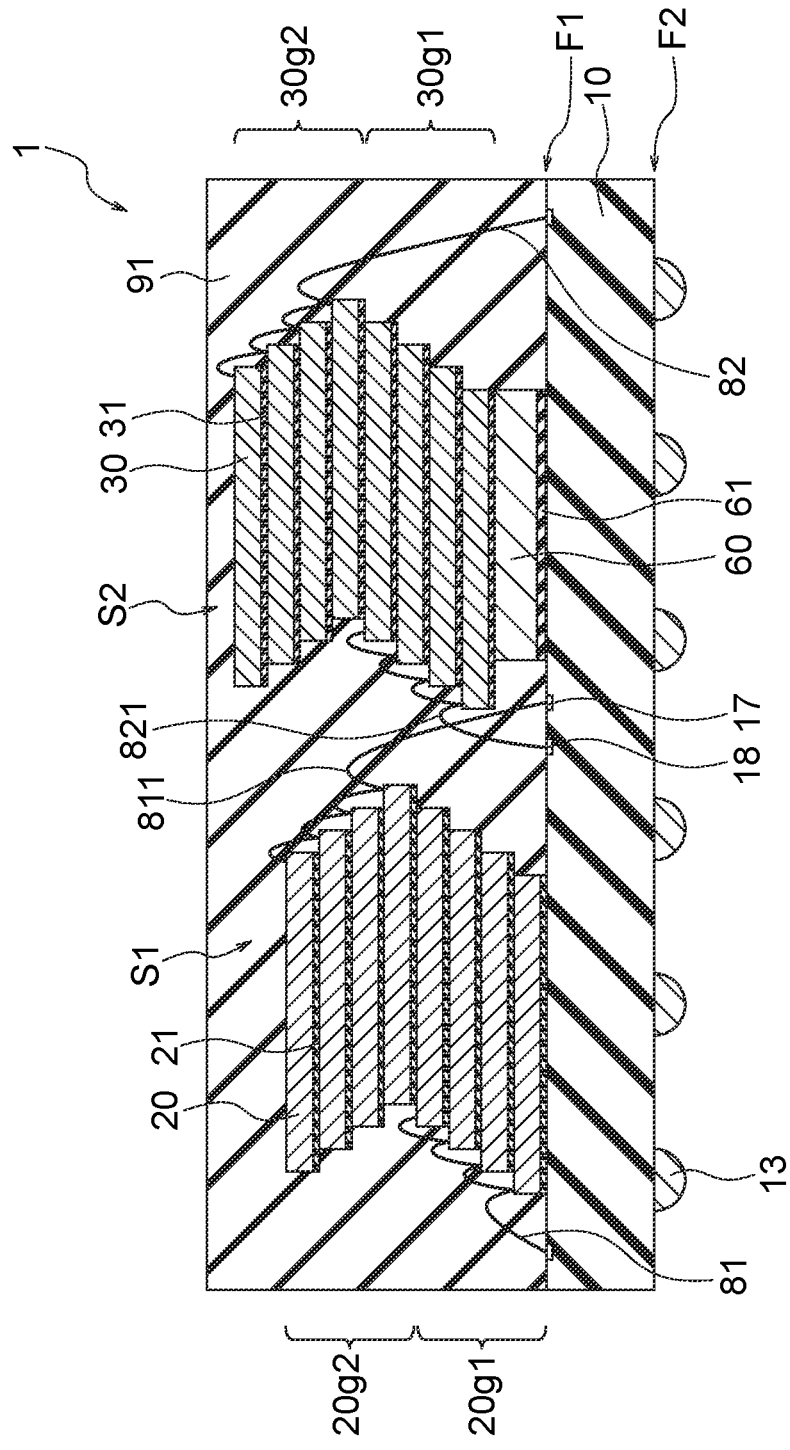
FIG. 15 is a sectional view showing an exemplary configuration of a semiconductor device according to an eighth embodiment.

FIG. 15 is a sectional view showing an exemplary configuration of a semiconductor device 1 according to an eighth embodiment. In the eighth embodiment, a spacer 60 is provided, unlike the third embodiment. The shift directions of the stack bodies S1, S2 are the same as the shift directions of the stack bodies S1, S2 shown in FIG. 8.

The semiconductor device 1 further includes the spacer 60 and an adhesion layer 61.

The spacer 60 is provided between the wiring substrate 10 and the stack body S2. The spacer 60 adheres to the surface F1 through the adhesion layer 61. For example, the spacer 60 is a silicon chip.

The space SP2 may be formed by the spacer 60, and the bonding wire 811 may extend to reach the space SP2.

The spacer 60 may be provided between the wiring substrate 10 and the stack body S1.

The other configuration of the semiconductor device 1 according to the eighth embodiment is the same as the corresponding configuration of the semiconductor device 1 according to the third embodiment, and therefore the detailed description is omitted.

As in the case of the eighth embodiment, the spacer 60 may be provided. The semiconductor device 1 according to the eighth embodiment can obtain the same effect as the effect of the third embodiment.

Ninth Embodiment

Figure 16:
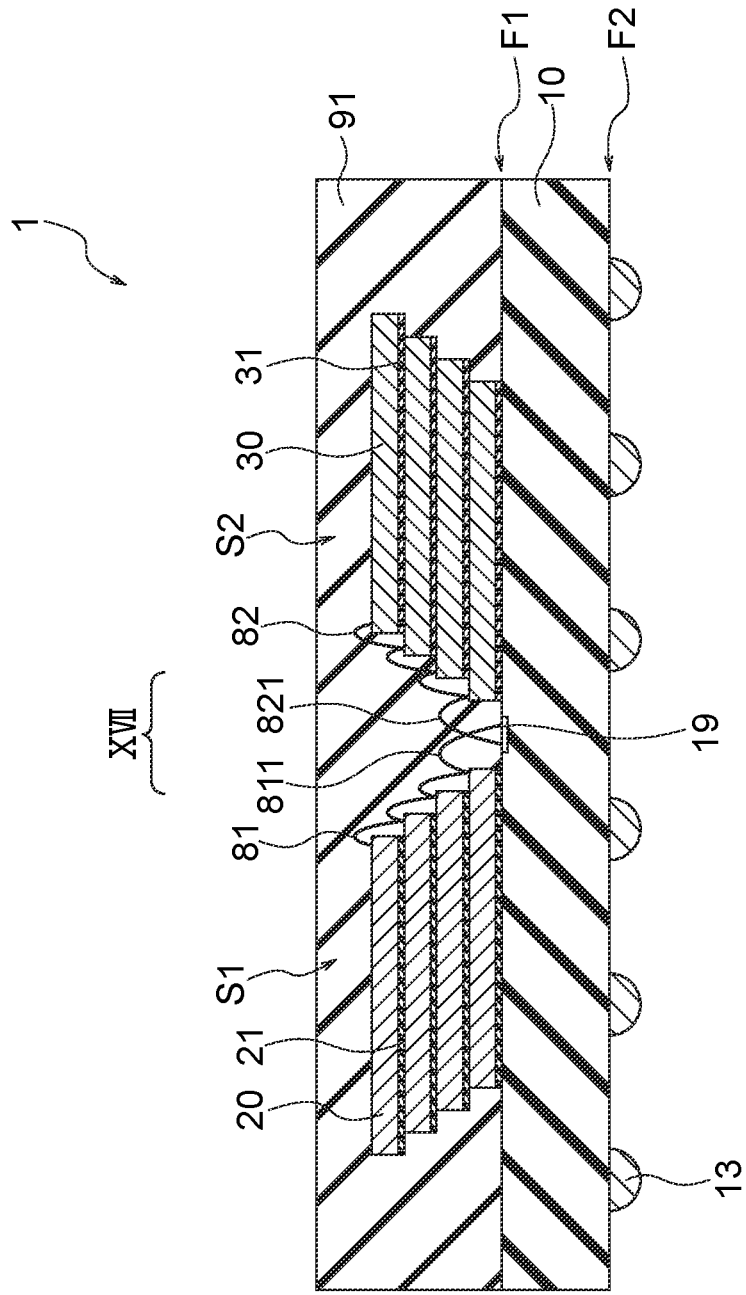
FIG. 16 is a sectional view showing an exemplary configuration of a semiconductor device according to a ninth embodiment.

FIG. 16 is a sectional view showing an exemplary configuration of a semiconductor device 1 according to a ninth embodiment. In the ninth embodiment, an identical pad is used as the pads 17, 18, unlike the first embodiment.

The wiring substrate 10 further includes a pad 19.

The pad 19 is electrically connected to both of the bonding wire 811 and the bonding wire 821. More specifically, the pad 19 connects pads 20$p$, 30$p$ for reference voltage supply to each other. For example, the reference voltage is the power source voltage or the ground voltage. Thereby, power source enhancement can be performed. The pad 19 may connect pads 20$p$, 30$p$ for signal input/output to each other.

FIG. 17 is a top view showing an exemplary configuration of the bonding wires 81, 82 and the pad 19 according to the ninth embodiment.

In addition to the pad 19, the pads 17, 18 shown in FIG. 2 are also provided. However, in FIG. 17, the pads 17, 18 are not illustrated.

The other configuration of the semiconductor device 1 according to the ninth embodiment is the same as the corresponding configuration of the semiconductor device 1 according to the first embodiment, and therefore the detailed description is omitted.

As in the case of the ninth embodiment, an identical pad may be used as the pads 17, 18. The semiconductor device 1 according to the ninth embodiment can obtain the same effect as the effect of the first embodiment.

Tenth Embodiment

Figure 18:
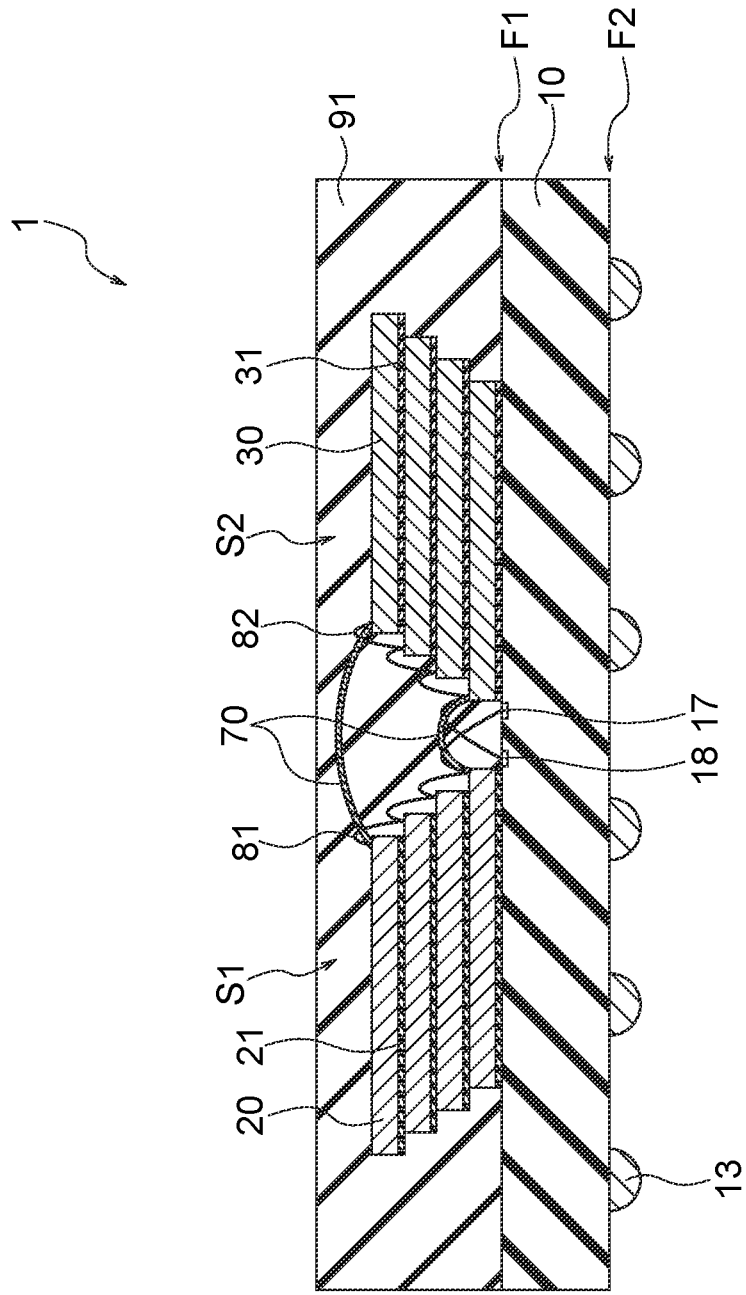
FIG. 18 is a sectional view showing an exemplary configuration of a semiconductor device according to a tenth embodiment.

FIG. 18 is a sectional view showing an exemplary configuration of a semiconductor device 1 according to a tenth embodiment. In the tenth embodiment, semiconductor chips are connected to each other between the stack bodies S1, S2, unlike the first embodiment.

The semiconductor device 1 further includes connection wirings 70. For example, the connection wirings 70 are bonding wires.

The connection wiring 70 electrically connects the semiconductor chip 20 and the semiconductor chip 30. More specifically, the connection wiring 70 connects pads 20$p$, 30$p$ for reference voltage supply to each other. For example, the reference voltage is the power source voltage or the ground voltage. Thereby, power source enhancement can be performed. The connection wiring 70 may connect pads 20$p$, 30$p$ for signal input/output to each other.

In FIG. 18, two connection wirings 70 are provided. However, the number of connection wirings 70 is not limited to two. Further, the connection wirings 70 are connected to the semiconductor chips 20, 30 at the first stage and fourth stage from the bottom. However, without being limited to this, the connection wirings 70 may be connected to semiconductor chips 20, 30 at other stages. The connection wiring 70 may connect the semiconductor chips 20, 30 at stages that are different between the stack S1 and the stack S2. For example, the connection wiring 70 may connect the fourth stage of the stack body S1 and the first stage of the stack body S2.

The other configuration of the semiconductor device 1 according to the tenth embodiment is the same as the corresponding configuration of the semiconductor device 1 according to the first embodiment, and therefore the detailed description is omitted.

As in the case of the tenth embodiment, semiconductor chips may be connected to each other between the stack S1 and the stack S2. The semiconductor device 1 according to the tenth embodiment can obtain the same effect as the effect of the third embodiment.

Eleventh Embodiment

Figure 19:
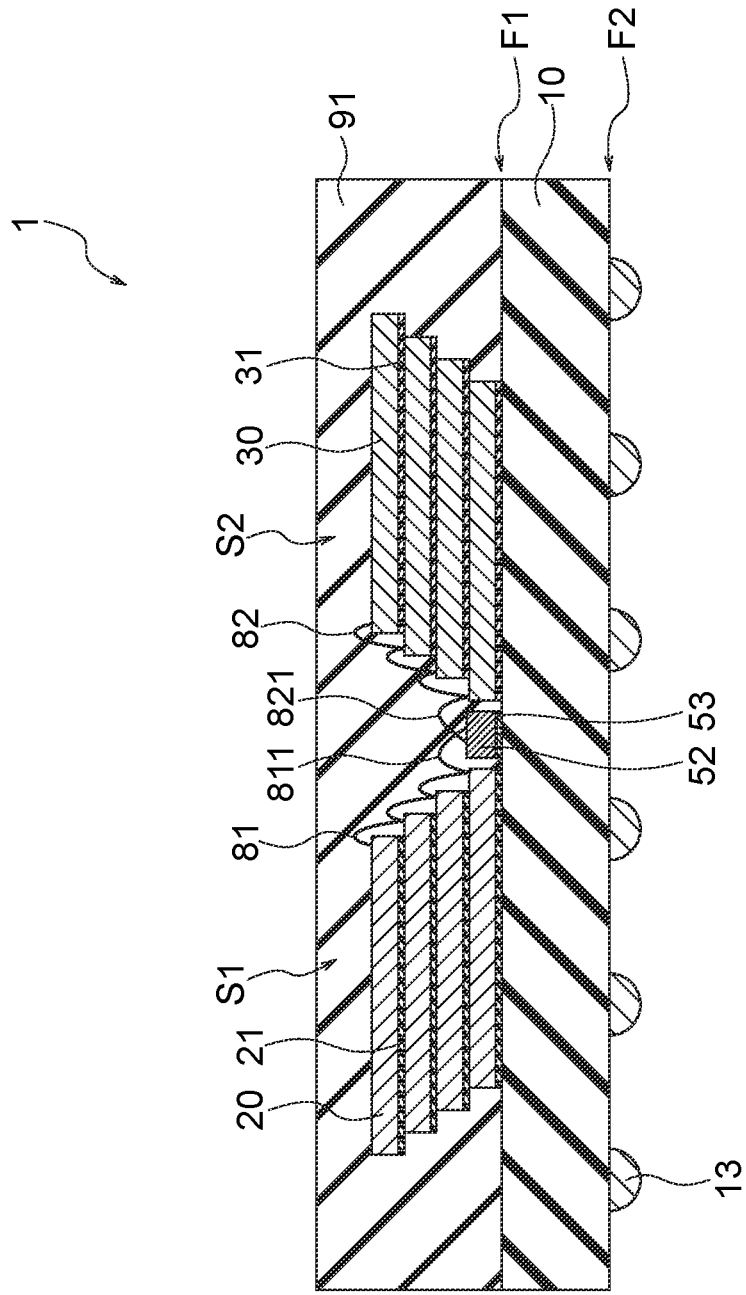
FIG. 19 is a sectional view showing an exemplary configuration of a semiconductor device according to an eleventh embodiment.

FIG. 19 is a sectional view showing an exemplary configuration of a semiconductor device 1 according to an eleventh embodiment. In the eleventh embodiment, a semiconductor chip 52 is provided unlike the first embodiment.

The semiconductor device 1 further includes the semiconductor chip 52 and an adhesion layer 53.

The semiconductor chip 52 is provided between the stack body S1 and the stack body S2. The semiconductor chip 52 includes a pad (not illustrated) on the upper surface. The semiconductor chip 52 adheres to the surface F1 through the adhesion layer 53. A bonding wire electrically connecting the semiconductor chip 52 and the wiring substrate 10 is not illustrated.

For example, the semiconductor chip 52 is a controller chip that controls a memory chip. An unillustrated semiconductor element is provided on a surface of the semiconductor chip 52 on the opposite side of a surface facing the wiring substrate 10. For example, the semiconductor element may be a CMOS circuit that constitutes a controller.

The bonding wires 811, 821 shown in FIG. 19 cross as viewed in the Y direction. More specifically, the bonding wires 811, 821 cross above the semiconductor chip 52. Thereby, the package size can be further reduced.

The bonding wire 81 or 82 may directly connect the semiconductor chip 52 and the semiconductor chip 20 or semiconductor chip 30, as in the relay chip 50 shown in FIG. 10A and FIG. 1013.

The other configuration of the semiconductor device 1 according to the eleventh embodiment is the same as the corresponding configuration of the semiconductor device 1 according to the first embodiment, and therefore the detailed description is omitted.

As in the case of the eleventh embodiment, the semiconductor chip 52 may be provided. The semiconductor device 1 according to the eleventh embodiment can obtain the same effect as the effect of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate including a first surface;
a first semiconductor chip provided on the first surface;
a second semiconductor chip provided at a position on the first surface that is apart from a position of the first semiconductor chip in a first direction, the first direction being substantially parallel to the first surface;
a first wire electrically connected to the first semiconductor chip and provided to extend to a side of the second semiconductor chip; and
a second wire electrically connected to the second semiconductor chip and provided to extend to a side of the first semiconductor chip, wherein
the first wire and the second wire cross as viewed in a third direction, the third direction being substantially perpendicular to both of the first direction and a second direction, the second direction being substantially perpendicular to the first surface.

2. The semiconductor device according to claim 1, further comprising:

a first stack body in which a plurality of semiconductor chips is stacked in the second direction; and
a second stack body in which a plurality of semiconductor chips is stacked in the second direction, wherein
the first semiconductor chip is one of the semiconductor chips in the first stack body, and
the second semiconductor chip is one of the semiconductor chips in the second stack body.

3. The semiconductor device according to claim 2, wherein:
the first stack body includes
a first chip group in which a plurality of semiconductor chips is stacked to be shifted in a fourth direction, the fourth direction being substantially parallel to the first surface, and
a second chip group in which a plurality of semiconductor chips is stacked to be shifted in an opposite direction of the fourth direction, the second chip group being provided on the first chip group; and
the second stack body includes
a third chip group in which a plurality of semiconductor chips is stacked to be shifted in a fifth direction, the fifth direction being substantially parallel to the first surface, and
a fourth chip group in which a plurality of semiconductor chips is stacked to be shifted in an opposite direction of the fifth direction, the fourth chip group being provided on the third chip group.

4. The semiconductor device according to claim 3, wherein:
the fourth direction is a direction of a side of the second stack body; and
the fifth direction is a direction of a side of the first stack body.

5. The semiconductor device according to claim 3, wherein the first wire extends to reach a space between the second stack body and the substrate, and/or the second wire extends to reach a space between the first stack body and the substrate.

6. The semiconductor device according to claim 3, further comprising a member including a first pad and a second pad that are electrically connected to the substrate, the member being provided between the first stack body and the second stack body, wherein:
the first wire is connected to the first pad; and
the second wire is connected to the second pad.

7. The semiconductor device according to claim 6, further comprising:
a third wire electrically connecting the first pad and the substrate; and
a fourth wire electrically connecting the second pad and the substrate, wherein
the third wire extends to reach a space between the second stack body and the substrate, and/or the fourth wire extends to reach a space between the first stack body and the substrate.

8. The semiconductor device according to claim 2, further comprising an electronic component provided on the substrate, wherein
the electronic component is disposed in at least a part of a space between the substrate and the first stack body or the second stack body in which a plurality of semiconductor chips is stacked to be shifted in a direction parallel to the first surface.

9. The semiconductor device according to claim 1, further comprising a spacer provided between the substrate and at least one of the first semiconductor chip and the second semiconductor chip.

10. The semiconductor device according to claim 1, wherein the substrate further includes a third pad electrically connected to both of the first wire and the second wire.

11. The semiconductor device according to claim 2, further comprising a connection wiring electrically connecting a semiconductor chip in the first stack body and a semiconductor chip in the second stack body.

12. The semiconductor device according to claim 1, further comprising a third semiconductor chip provided between the first semiconductor chip and the second semiconductor chip, wherein
the first wire and the second wire cross above the third semiconductor chip as viewed in the third direction.

13. The semiconductor device according to claim 1, wherein each of the first wire and the second wire includes a ball bonding portion at an end portion on an opposite side of the substrate, and includes a wedge bonding portion at an end portion on a side of the substrate.

14. A manufacturing method of a semiconductor device, comprising:

providing a member on a first surface of a substrate, the member including a first pad and a second pad;

providing a first stack body and a second stack body on both sides of the member along a first direction, each of the first stack body and the second stack body being a stack body in which a plurality of semiconductor chips is stacked, the first direction being substantially parallel to the first surface; and forming a first wire and a second wire, the first wire electrically connecting the first stack body and the first pad, the second wire electrically connecting the second stack body and the second pad, wherein the first wire and the second wire cross as viewed in a third direction, the third direction being substantially perpendicular to both of the first direction and a second direction, the second direction being substantially perpendicular to the first surface.

15. The manufacturing method of the semiconductor device according to claim 14, further comprising forming a third wire and a fourth wire after providing the member, the third wire electrically connecting the first pad and the substrate, the fourth wire electrically connecting the second pad and the substrate.

* * * * *